United States Patent
Bao et al.

(10) Patent No.: US 10,869,392 B2
(45) Date of Patent: Dec. 15, 2020

(54) FLEXIBLE AND SELF-HEALING ELASTOMER-BASED MODULAR ELECTRONICS AND APPLICATIONS THEREOF

(71) Applicant: The Board of Trustees of the Leland Stanford Junior University, Stanford, CA (US)

(72) Inventors: Zhenan Bao, Stanford, CA (US); Jiheong Kang, Palo Alto, CA (US); Donghee Son, Palo Alto, CA (US); Orestis Vardoulis, Palo Alto, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 0 days.

(21) Appl. No.: 16/155,592

(22) Filed: Oct. 9, 2018

(65) Prior Publication Data
US 2019/0110363 A1    Apr. 11, 2019

Related U.S. Application Data

(60) Provisional application No. 62/569,277, filed on Oct. 6, 2017.

(51) Int. Cl.
*H05K 3/20* (2006.01)
*H05K 1/14* (2006.01)
(Continued)

(52) U.S. Cl.
CPC ............. *H05K 1/147* (2013.01); *H01R 12/00* (2013.01); *H05K 1/0283* (2013.01); *H05K 1/115* (2013.01);
(Continued)

(58) Field of Classification Search
CPC .... H05K 1/147; H05K 1/0283; H05K 3/4076; H05K 3/386; H05K 1/118; H05K 1/115;
(Continued)

(56) References Cited

U.S. PATENT DOCUMENTS 6,573,456 B2 * 6/2003 Spruell .................. H01B 7/184
174/110 R
7,618,260 B2   11/2009 Simon et al.
(Continued)

OTHER PUBLICATIONS

White, S. R. et al. Autonomic healing of polymer composites. Nature 409, 794-797 (2001).
(Continued)

*Primary Examiner* — Donghai D Nguyen
(74) *Attorney, Agent, or Firm* — Crawford Maunu PLLC

(57) ABSTRACT

Various embodiments are directed to a method of forming an apparatus including placing a first electronic circuit in contact with a second electronic circuit, wherein each of the first and second electronic circuits have connector circuits configured and arranged to provide an electrical connection between the first and second electronic circuits and are formed with a polymer film that is configured to adhere, via self-healing, to another polymer film. The method further includes, in response to the contact, causing or facilitating the self-healing of the respective polymer films of the first and second electronic circuits, thereby creating the electrical connection therebetween.

12 Claims, 35 Drawing Sheets
(14 of 35 Drawing Sheet(s) Filed in Color)

(51) Int. Cl.

| | |
|---|---|
| *H05K 1/11* | (2006.01) |
| *H05K 3/38* | (2006.01) |
| *H05K 3/40* | (2006.01) |
| *H01R 12/00* | (2006.01) |
| *H05K 1/02* | (2006.01) |
| *H01R 4/58* | (2006.01) |
| *H01R 12/62* | (2011.01) |
| *H01R 107/00* | (2006.01) |
| *H05K 1/18* | (2006.01) |

(52) U.S. Cl.
CPC ............ *H05K 1/118* (2013.01); *H05K 3/386* (2013.01); *H05K 3/4076* (2013.01); *H01R 4/58* (2013.01); *H01R 12/62* (2013.01); *H01R 2107/00* (2013.01); *H01R 2201/12* (2013.01); *H01R 2201/20* (2013.01); *H05K 1/189* (2013.01); *H05K 2201/0133* (2013.01); *H05K 2201/0314* (2013.01); *H05K 2201/058* (2013.01); *H05K 2201/10106* (2013.01); *H05K 2203/0759* (2013.01); *H05K 2203/128* (2013.01)

(58) Field of Classification Search
CPC ........... H05K 1/189; H05K 2201/0133; H05K 2201/058; H05K 2201/0314; H05K 2203/0759; H01R 12/00; H01R 4/58; Y10T 29/49128; Y10T 29/49195
USPC .................................. 29/831, 854, 856, 869
See application file for complete search history.

(56) References Cited

U.S. PATENT DOCUMENTS

| | | | |
|---|---|---|---|
| 8,063,307 B2* | 11/2011 | Bukshpun | A41D 1/005 174/102 SC |
| 8,907,376 B2 | 12/2014 | Mascaro et al. | |
| 9,184,496 B2 | 11/2015 | Duwel et al. | |
| 9,293,821 B2 | 3/2016 | Duwel et al. | |
| 9,454,181 B2 | 9/2016 | Ilse et al. | |
| 2009/0240117 A1 | 9/2009 | Chmiel et al. | |
| 2010/0238636 A1 | 9/2010 | Mascaro et al. | |
| 2016/0094259 A1 | 3/2016 | Hatanaka et al. | |

OTHER PUBLICATIONS

Chen, X. et al. A thermally re-mendable cross-linked polymeric material. Science 295, 1698-1702 (2002).
Toohey, K. S., Sottos, N. R., Lewis, J. A., Moore, J. S. & White, S. R. Self-healing materials with microvascular networks. Nature Mater. 6, 581-585 (2007).
2008 Cordier, P., Tournilhac, F., Soulie-Ziakovic, C. & Leibler, L. Self-healing and thermoreversible rubber from supramolecular assembly. Nature 451, 977-980 (2008).
De Greef, T. F. A. et al. Supramolecular polymerizations. Chem. Rev. 109, 5687-5754 (2009).
Burnworth, M. et al. Optically healable supramolecular polymers. Nature 472, 334-337 (2011).
Kim, D-H. et al. Epidermal electronics. Science. 333, 836-843 (2011).
Zehe, S., Grosshauser, T. & Hermann, T. BRIX—an easy-to-use modular sensor and actuator prototyping toolkit. in 2012 IEEE International Conference on Pervasive Computing and Communications Workshops 817-822 (IEEE, 2012). doi:10.1109/PerComW.2012.6197624.
Sun, J. Y. et al. Highly stretchable and tough hydrogels. Nature 489, 133-136 (2012).
Chen, Y., Kushner, A. M., Williams, G. A. & Guan, Z. Multiphase design of autonomic self-healing thermoplastic elastomers. Nature Chem. 4, 467-472 (2012).
Blaiszik, B. J. et al. Autonomic restoration of electrical conductivity. Adv. Mater. 24, 398-401 (2012).
Tee, B. C.-K.,Wang, C., Allen, R. & Bao, Z. An electrically and mechanically self-healing composite with pressure- and flexion-sensitive properties for electronic skin applications. Nature Nanotech. 7, 825-832 (2012).
Kaltenbrunner, M. et al. An ultra-lightweight design for imperceptible plastic electronics. Nature 499, 458-463 (2013).
Yang, Y. & Urban, M. W. Self-healing polymeric materials. Chem. Soc. Rev. 42, 7446-7467 (2013).
Sun, T. L. et al. Physical hydrogels composed of polyampholytes demonstrate high toughness and viscoelasticity. Nature Mater. 12, 932-937 (2013).
Palleau, E, Reece, S., Desai, S. C., Smith, M. E. & Dickey, M. D. Self-healing stretchable wires for reconfigurable circuit wiring and 3D microfluidics. Adv. Mater 25, 1589-1592 (2013).
Li, Y., Chen, S., Wu, M. & Sun, J. Polyelectrolyte multilayers impart healability to highly electrically conductive films. Adv. Mater. 25, 4186-4191 (2013).
Wang, C. et al. Self-healing chemistry enables the stable operation of silicon microparticle anodes for high-energy lithium-ion batteries. Nature Chem. 5, 1042-1048 (2013).
Son, D. et al. Multifunctional wearable devices for diagnosis and therapy of movement disorders. Nat. Nanotechnol. 9, 397-404 (2014).
Ducrot, E., Chen, Y., Bulters, M., Sijbesma, R. P. & Creton, C. Toughening elastomers with sacrificial bonds and watching them break. Science 344, 186-189 (2014).
Dementyev, A. & Paradiso, J. A. SensorTape: Modular and Programmable 3D-Aware Dense Sensor Network on a Tape d. Proc. 28th Annu. ACM Symp. User Interface Softw. Technol.—UIST '15 649-658 (2015). doi:10.1145/2807442.2807507.
Neal, J. A., Mozhdehi, D. & Guan, Z. Enhancing mechanical performance of a covalent self-healing material by sacrificial noncovalent bonds. J. Am. Chem. Soc. 137, 4846-4850 (2015).
Grindy, S. C. et al. Control of hierarchical polymer mechanics with bioinspired metal-coordination dynamics. Nature Mater. 14, 1210-1216 (2015).
Iyer, B. V. et al. Ductility, toughness and strain recovery in self-healing dual cross-linked nanoparticle networks studied by computer simulations. Prog. Polymer Sci. 40, 121-137 (2015).
Truby, R. L. & Lewis, J. A. Printing soft matter in three dimensions. Nature 540, 371-378 (2016).
Chortos, A., Liu, J. & Bao, Z. Pursuing prosthetic electronic skin. Nature Mater. 15, 937-950 (2016).
Patrick, J. et al. Polymers with autonomous life-cycle control. Nature. 540, 363-370 (2016).
Li, C.-H. et al. A highly stretchable autonomous self-healing elastomer. Nature Chem. 8, 618-624 (2016).
Bai, W. et al. Smart organic two-dimensional materials based on a rational combination of non-covalent interactions. Angew .Chem. Int.Ed. 55, 10707-10711 (2016).
Zhang, Y. et al. Printing, folding and assembly methods for forming 3D mesostructures in advanced materials. Nat. Rev. Mater. 2, 17019 (2017).

\* cited by examiner

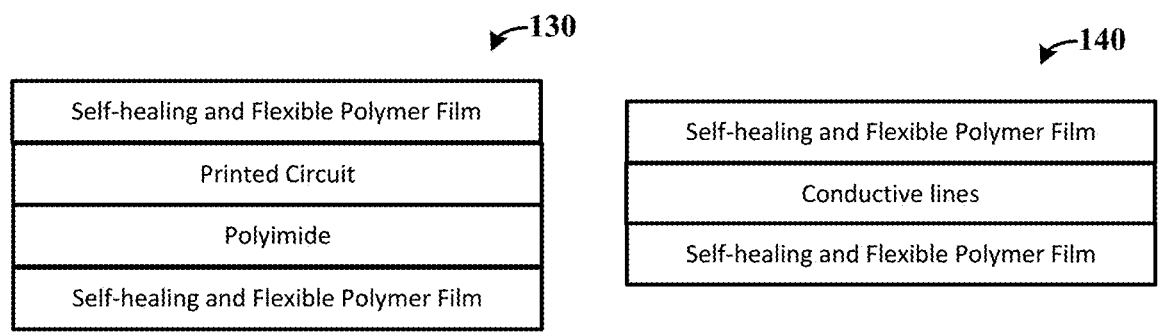
FIG. 1C　　FIG. 1D
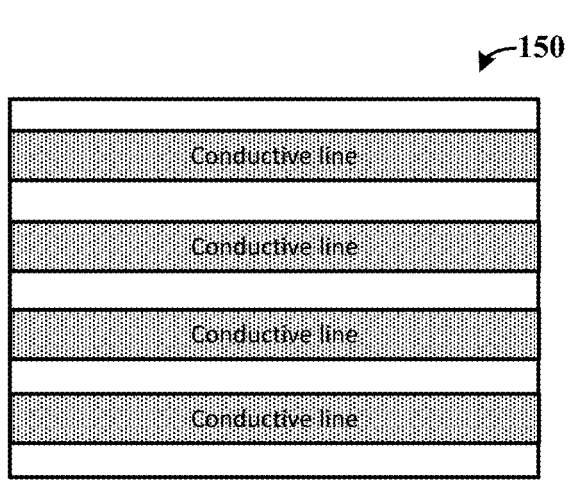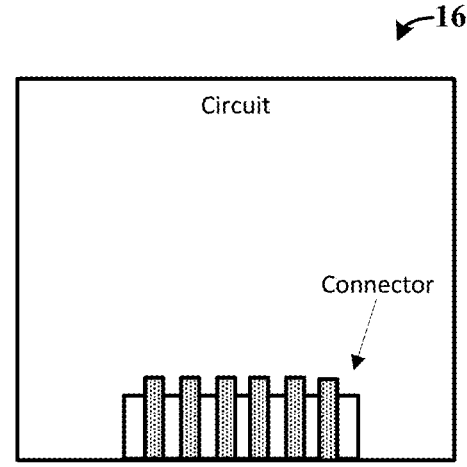
FIG. 1E　　FIG. 1F

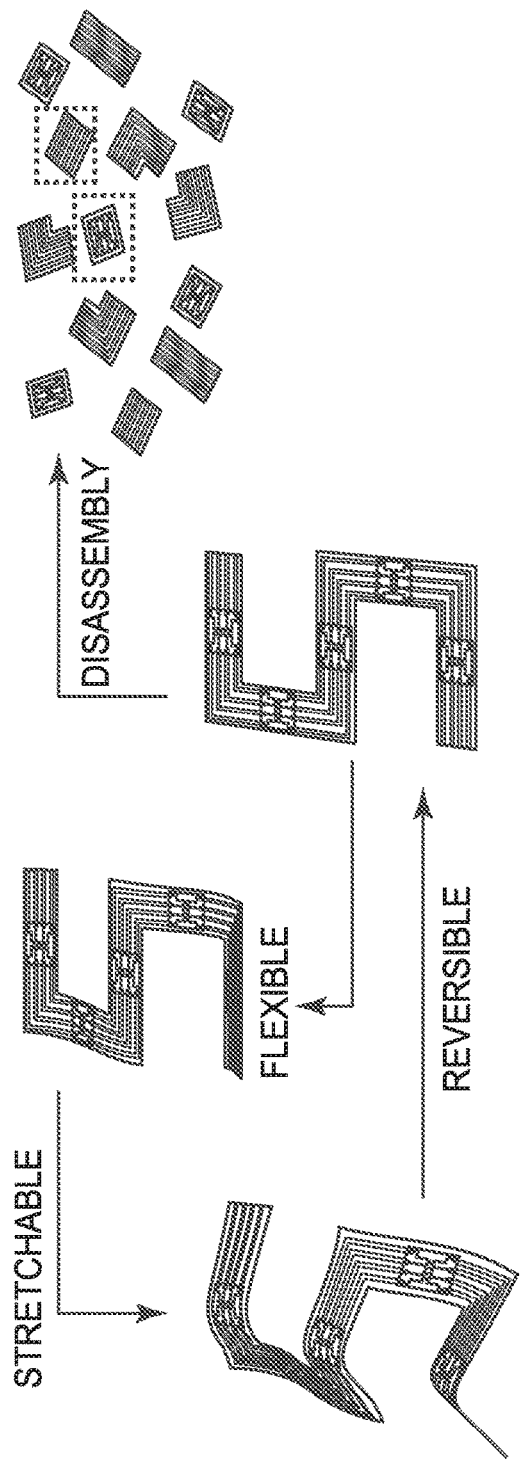
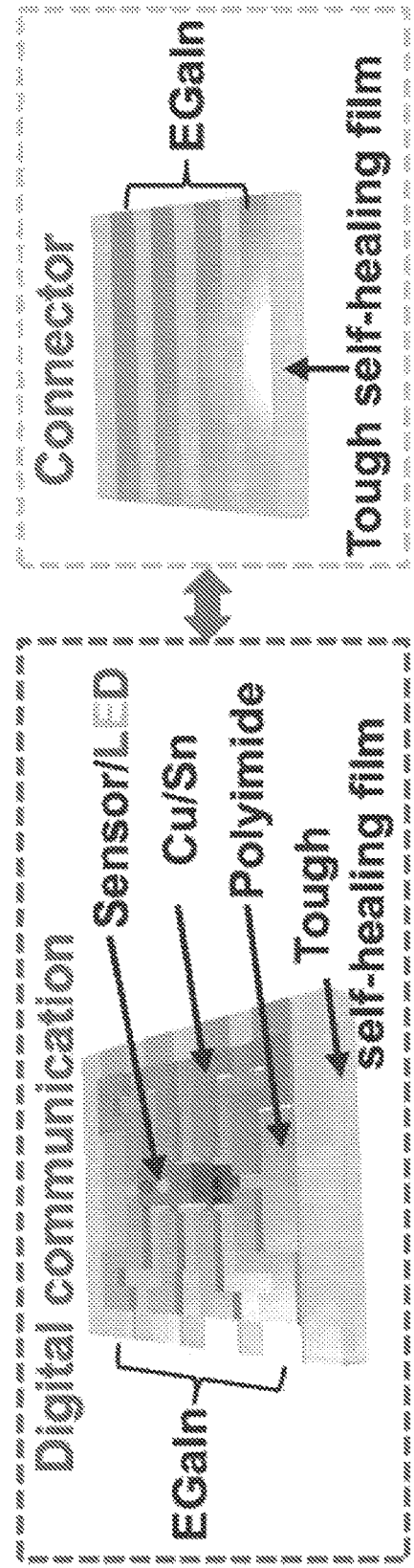
FIG. 2A
FIG. 2B
FIG. 2C

Metal ion control

Strong metal-ligand interactions

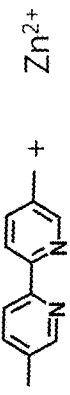
$Zn^{2+}$

Moderate metal-ligand interactions

$Fe^{2+}$

Weak metal-ligand interactions

$Eu^{3+}$

Ligand control

Strong metal-ligand interactions

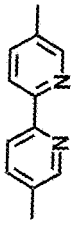
bipyridine

Moderate metal-ligand interactions

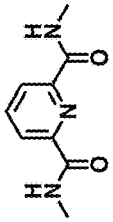
Pyridine-2,6-dicarboxamid

Weak metal-ligand interactions

Carboxylate

Pyridine

Counter anion control

Strong metal-ligand interactions $Cl^{-1}$

Moderate metal-ligand interactions $OTf^{-1}$

Weak metal-ligand interactions $BF_4^{-1}$ $ClO_4^{-1}$

FIG. 4I

Self-healable electrode
PDMS
-MDU$_{0.4}$-IU$_{0.6}$

Liquid metal

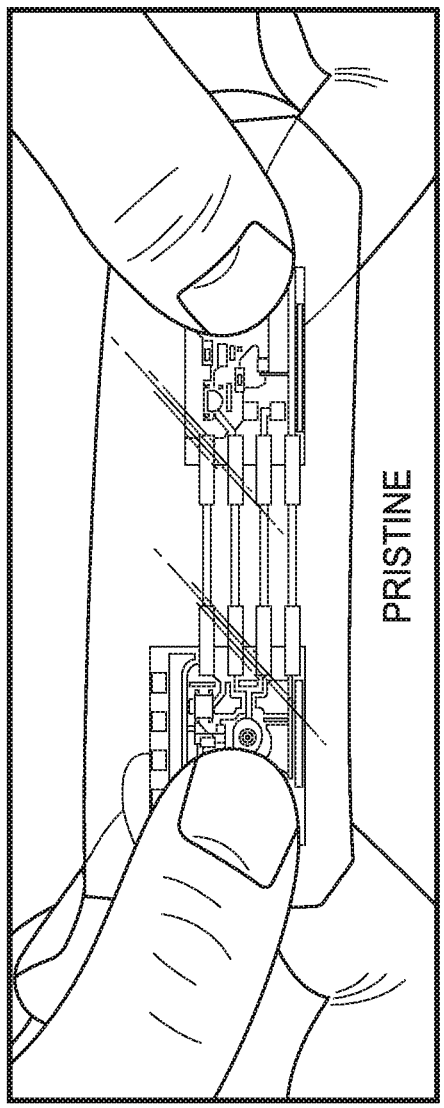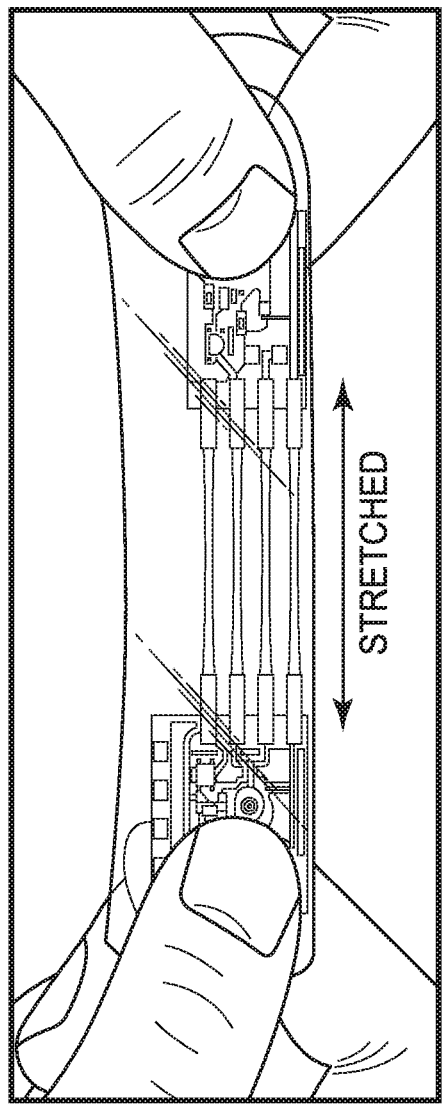

r.t bonding process (autonomous self-healing) for robust interconnections

Circuit design of RGD LED module (WS2812)

FLEXIBLE AND SELF-HEALING ELASTOMER-BASED MODULAR ELECTRONICS AND APPLICATIONS THEREOF

SUMMARY

Aspects of various embodiments are directed to flexible and self-healing elastomer-based modular electronics and applications thereof, including applications of wearable electronics.

In the following discussion, various implementations and applications are disclosed to provide an understanding of the instant disclosure by way of non-limiting example embodiments.

In certain specific example embodiments of the present disclosure, aspects are directed to using an elastomer material to form different modular electronics, wearable electronics, and other applications. For example, a circuit-based apparatus can be tunably reconfigured using flexible circuits and connector circuits that can be mechanically and electronically connected. In some specific aspects, the different modular electronics can be formed into a wearable band (e.g., wristband, armband, chest-band, necklace, an attachable patch).

The apparatus can include different electronic circuits that can be attached via connector circuits. The electronic circuits and connector circuits are sometimes herein referred to as the "modular electronics." Each of the electronic circuits and connector circuits can be formed using a layer of self-healing and flexible/stretchable polymer film such that the respective electronic circuits and connector circuits can be disconnected from one another via a cutting process and reconnected to each other or other modular electronics. Responsive to placing respective modular electronic components in contact with one another, the electronic circuits/connectors that are adjacent one another can heal or adhere to one another, without the application of force on either connecting side, thus creating an electrical connection. The healing can occur at room temperature, in specific aspects. The resulting apparatus is flexible, stretchable, and self-healing. Further, the apparatus can be repeatedly reconfigured due to the self-healing. In related and more specific aspects, the polymer film exhibits autonomous self-healing in the presents of water, sweat, and/or artificial sweat, among other types of liquids.

In specific aspects, a variety of different electronic circuits can be used. Example electronic circuits can include sensing circuitry (e.g., temperature sensors, pressure or strain sensors, atmospheric sensors), light sources (e.g., light emitting diodes (LED)), processing circuitry, etc. The electronic circuits can be in a variety of geometries, form factors, have various surface treatments (e.g., sticky, non-stick, roughness, micro-pillars) and a variety of encapsulation materials. The connector circuits can include conductive line(s) formed on a layer of self-healing and flexible polymer film. The conductive lines can be formed of a variety of different conductive material, such as liquid ink, PEDOT PSS, silver nanowires, metal/nano-particles. Further, the conductive lines can have a variety of different geometries (e.g., height, width) of channels, encapsulation thickness, stiffness, and variety of different external surface treatments (e.g., sticky, non-stick, roughness, micro-pillars).

The elastomer material can comprise and/or involve a flexible polymer backbone, such as polydimethylsiloxane (PDMS), polyethyleneoxide (PEO), Perfluoropolyether (PFPE), polybutylene (PB), poly(ethylene-co-1-butylene), poly(butadiene), hydrogenated poly(butadiene), polybutylene, poly(ethylene oxide)-poly(propylene oxide) block copolymer or random copolymer, and poly(hydroxyalkanoate), with a particular ratio of a first moiety (e.g., strong bonds) and a second moiety of a weaker crosslinking bonding strength than the first moiety (e.g., weak bonds) in polymer chains, and films formed therefrom, such films being self-healing, tough, and stretchable, consistent with one more embodiments and/or one or more mechanisms described herein. In specific aspects, the polymer film can include a PDMS polymer backbone with a particular ratio of 4,4'-methylenebis(phenyl urea) (MPU) and isophorone bisurea (IU). In such aspects, the first moieties include MPU and the second moieties include IU, although embodiments are not so limited. However, embodiments are not so limited and a variety of different self-healing and flexible elastomers can be used. For example, the flexible and self-healing polymer films can exhibit strain maximum strain of between 200-3,000 percent and/or 600-3,000 percent in some embodiments (which is also the fracture strain), fracture energy of 12,000-15,000 J/m$^2$, self-healing efficiencies of 80-100 percent at room temperature for three to forty-eight hours, and/or greater efficiencies at higher temperatures in some embodiments.

A number of specific aspects are directed to an apparatus that includes a plurality of electronic circuits and a plurality of connector circuits. Each of the plurality of electronic circuits and the plurality of connector circuits include a self-healing and flexible polymer film that can adhere, via self-healing, to another self-healing and flexible polymer film. And with the plurality of electronic circuits being electrically connected to one another via the self-healing. The polymer film can contain a conductive material on a surface or inside, such as carbon nanotubes, silver nanowires, metallic nanowire, silver flakes, metallic flakes, silver particles, and/or metallic particles. In various embodiments, each of the plurality of electronic circuits includes one or more of the plurality of connector circuits (e.g., embedded connector circuits). Alternatively and/or in addition, one or more of the plurality of connector circuits can be formed separately from the electronic circuits. In various aspects, the connector circuits include conductive lines formed on a layer of the polymer film and the electronic circuits include printed electronics formed on a layer of the self-healing and flexible polymer film. In a number of related aspects, at least a portion of the plurality of electronic circuits include sensor circuitry (e.g., temperature, pressure/strain, atmospheric). In other aspects, each of the plurality of electronic circuits include a circuit selected from the group consisting of: sensing circuitry, light sources, and processing circuitry. At least one of the plurality of electronic circuits can include a self-healing electrode that has a patterned liquid metal alloy encapsulated by the polymer film. In specific aspects, the resistance of the conductive polymer connection is less than 1 kilo-ohm (kohm), less than 100 ohm, or less than 10 ohm.

The polymer film can have a variety of properties. For example, the polymer film can exhibit a fracture strain of between 200-3,000 percent, fracture energy of between 12,000 and 15,000 J/m$^2$ and self-healing efficiencies of between 80 to 100 percent at room temperature for three to 48 hours exposure. As previously described, the polymer film can have a flexible polymer backbone selected from the group consisting of: PDMS, PEO, PFPE, PB, poly(ethylene-co-1-butylene), poly(butadiene), hydrogenated poly(butadiene), polybutylene, poly(ethylene oxide)-poly(propylene oxide) block copolymer or random copolymer, and poly(hydroxyalkanoate).

Various specific aspects are directed to the uses of the elastomer material, disclosed herein, in the application of a wearable circuitry. As with the remarkable network of sensitive diverse sensors provided by human skin, specific aspects of the present disclosure are applicable for tactile sensing, health monitoring, and temperature sensing. Consistent with various embodiments, electronic sensors (e.g., force and otherwise) are formed using the elastomer of the present disclosure and are able to convert mechanical stimuli into signals, which are then interpreted as beneficial to the particular application. As with human skin, particular embodiments include electronic skin (e-skin) devices which mimic properties of human skin for applications such as wearable devices, artificial prosthetics, health monitoring and robotics. In this context, e-skin is an artificial skin that mimics properties of skin using surface-interfacing structures which are integrated with electronics (e.g., electronic circuitry). Other specific embodiments are directed to applications of medical devices, health monitoring devices, Internet of Things apparatuses, robotic applications, other types of wearable devices, and other electronic circuitry.

A number of aspects are directed to methods of forming the above-described apparatus. An example method includes placing a first electronic circuit in contact with a second electronic circuit, wherein each of the first and second electronic circuits have connector circuits that provide an electrical connection between the first and second electronic circuits and are formed with a polymer film that is configured to adhere, via self-healing, to another polymer film. The method further includes, in response to the contact, causing the respective polymer films of the first and second electronic circuits to self-heal by allowing for this self-healing in an environment which creates the electrical connection therebetween. Allowing for the self-healing can be with or without pressure applied to the first and second circuits and/or can be at room temperature, and with the electrical connection being formed without soldering or use of conductive adhesives. For example, facilitating this the self-healing can include applying force on the connecting side of the first and second electronic circuits relative to the connector circuits, the connector circuits including conductive lines formed on a layer of the polymer film. In other aspects, this self-healing process can include placing the first electronic circuit in contact with the second electronic circuit for a period of time and without the application of force on either connecting side, thereby creating the electrical connection. In some specific aspects, the self-healing is in the presence of liquid, such as water or sweat. The polymer film can include the previously described self-healing and flexible polymer film. Additionally, electrical connections between a plurality of electronic circuits, including the first and second electronic circuits and at least one additional electronic circuit, via self-healing of respective polymer films and/or to form a three-dimensional structure with the plurality of electronic circuits.

In various aspects, the method can further include disconnecting the first electronic circuit and the second electronic circuit via cutting of the respective connector circuits. For example, self-healing of the respective polymer films of the first and second electronic circuits can additional occur, thereby creating a different electrical connection and resulting in a different configuration.

Related and more-specific aspects are directed to a method of forming an apparatus that includes placing a plurality of flexible electronic circuits in contact with another of the plurality of electronic circuits. As previously described, each of the plurality of electronic circuits have embedded connector circuits having conductive lines that provide electrical connection between and which are formed with a polymer film that is configured to adhere, via self-healing, to another polymer film. In response to the contact, the method further includes bonding adjacent electronic circuits by facilitating the self-healing of the respective polymer films of the connector circuits, and thereby creating the electrical connection between respective conductive lines. In various specific aspects, the electronic circuits include printed electronics formed on a layer of the self-healing and flexible polymer film and the connector circuits include conductive lines formed on a layer of the self-healing and flexible polymer film. The bonding can occur in the presence of liquid and/or while the apparatus is in use, such as self-healing of a wearable device while a user is wearing the device and sweating.

The above discussion/summary is not intended to describe each embodiment or every implementation of the present disclosure. The figures and detailed description that follow also exemplify various embodiments.

BRIEF DESCRIPTION OF FIGURES

The patent or application file contains at least one drawing executed in color. Copies of this patent or patent application publication with color drawing(s) will be provided by the Office upon request and payment of the necessary fee.

Various example embodiments may be more completely understood in consideration of the following detailed description in connection with the accompanying drawings, in which:

FIG. 1C illustrates a side view of an example electronic circuit as illustrated by FIG. 1A and/or FIG. 1B, in accordance with various embodiments;

FIG. 1D illustrates a side view and FIG. 1E illustrates a top down view of an example connector circuit as illustrated by FIG. 1B, in accordance with various embodiments; and FIG. 1E illustrates an example of an electronic circuit with an embedded connector circuit as illustrated by FIG. 1A, in accordance with various embodiments;

FIG. 1F illustrates an example of an electronic circuit with an embedded connector circuit, in accordance with various embodiments;

FIGS. 2A-2D illustrate an example of an assembly, in accordance with various embodiments;

FIGS. 4A-4I illustrate example properties of polymer films formed using the elastomer material, in accordance with various embodiments;

FIGS. 8A-8B illustrate optical images of a wearable device and stretched device, in accordance with various embodiments;

Figure 1A:
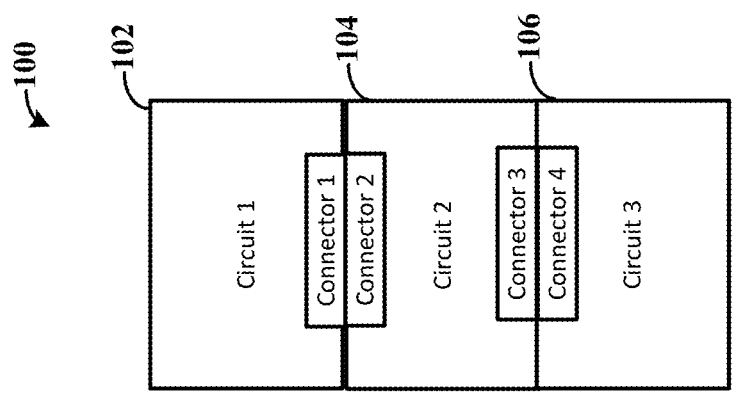
FIGS. 1A-1B illustrate an example of different modular electronics and an assembly thereof, in accordance with various embodiments.
Figure 1A:
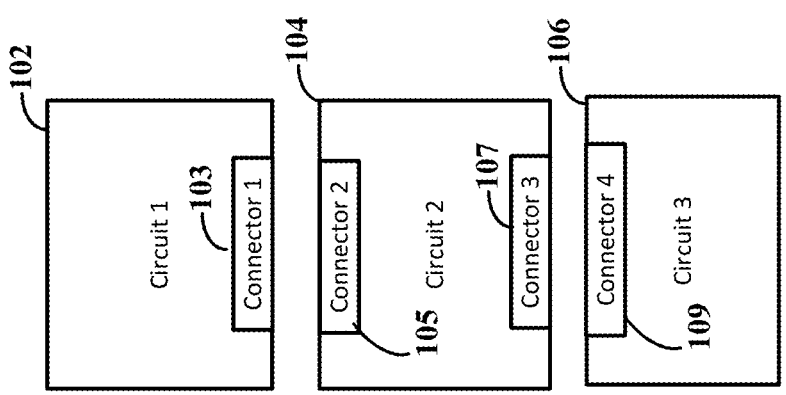

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to variety of stretchable and self-healing elastomer-based modular electronics and applications thereof. In certain implementations, aspects of the present disclosure have been shown to be beneficial when used in the context of wearable circuits, such as skin-like tactile sensor, but it will be appreciated that the instant disclosure is not necessarily so limited. Various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Particular example embodiments are directed to a stretchable, self-healing, and, optionally, mechanically tough elastomer material, which can be used to form different modular electronics. The modular electronics can include different electronic circuits and connector circuits to connect electronic circuits to one another. The modular electronics can be disconnected from one another and reconnected via cutting the connector circuits and then placing respective components together in different configurations (e.g., order/different parts). The connector circuits and respective electronic circuits can connect and/or reconnect via a self-healing process, which can occur via the mechanical properties of a self-healing and flexible polymer layer of the modular electronics. In some specific embodiments, a plurality of flexible printed circuit boards (PCBs) and devices can be connected without soldering or conductive adhesives while offering an unmatched self-healing ability for the entire encapsulation material of the modules. The inherent stretchability of the encapsulating material along with the flexibility of the circuit board substrate can also enable the stacking and positioning of electronics on non-flat surfaces enabling a variety of applications.

The use of simple modular building blocks, for the creation of complex structures, can be used for modern design and engineering. Modular electronics can be used for a gamut of applications, such as promotion of creativity, self-assembling robots and customizable consumer electronics, and wearable technologies. In accordance with various embodiments, a self-healing and stretchable/flexible (and optionally mechanically tough) materials can allow for realization of a reconfigurable and multifunctional modular platform for wearable electronics. In various embodiments, the polymer is additionally mechanically tough, which can be beneficial for stretchable modular electronics.

In accordance with various embodiments, the elastomer material is self-healing. Surprisingly, the self-healing of the elastomer can take place in water in accordance with various specific embodiments. The self-healing of the elastomer can be achieved by tuning the ratio of strong and weak cross-linking dynamic bonds in the supramolecular structure that exhibits superior mechanical properties in stretchability, toughness and self-healability (as further illustrated herein by FIGS. 4A-4I). Various embodiments include different elastomers formed of polydimethylsiloxane (PDMS) polymers with various ratios of 4,4'-methylenebis(phenyl urea) (MPU) and isophorone bisurea units (IU) (e.g., as further illustrated by FIGS. 3A-3B). PDMS and dynamic bonds are chosen based on their biocompatibility and containment of no toxic elements, therefore, making the resulting elastomer material an ideal carrier for wearable electronics and biomedical applications. As may be appreciated, dynamic bonds include or refer to bonding that can be reformed, once broken due to mechanical forces, at room temperature or elevated temperature, such as hydrogen bonding, metal-ligand bonding, guest-host interactions, and supramolecular interactions. In specific embodiments, each of the PDMS-MPUx-IU1-x polymers form colorless and transparent films. The films can be stretched to sixteen times its original length at a loading rate of 20 mm/min (200 percent/min) without rupturing. The polymer films, surprisingly, are able to achieve notch-insensitive stretching up to 1200 percent strain, demonstrating its exceptional toughness. Other previously formed and typical PDMS substrates rupture at less than 200 percent strain. Other substrates, such as polyurethane and styrene-ethylene-butylene styrene (SEBS) rupture at 700 percent and 280 percent strain, respectively (Table 1). Moreover, the above-described elastomer material, formed as a film, can achieve notch-insensitive stretching at more than 150 percent strain, indicating higher toughness than other material and fracture intolerance to tear (see, for example Table 1). Notch-insensitive stretching, as used herein, includes or refers to stretching of a polymer film having a notch therein. Although embodiments are not so limited and can include a different types of polymer backbones and types of moieties, as further described herein.

Other example polymers can be used in various embodiments that are both stretchable and self-healing. An example polymer film can include a flexible elastomer having incorporated sacrificial bonds within a triple network. Other example polymers have introduced non-covalent sacrificial bonds into a covalent polymer network and observe significantly enhanced ductility and toughness. Further example polymers include a design concept of combining two types of metal-ligand crosslinks to control polymer network mechanical properties and a supramolecular elastomer cross-linked by three kinds of dynamic metal-ligand interactions and with some of the self-recoverable interactions during strain. Such a reversible energy dissipation system can be used for autonomous self-healing. For more general information on polymers and specific information on example stretchable and healable polymers, reference is made to Ducrot, E., et al., "Toughening elastomers with sacrificial bonds and watching them break", Science 344, 186-189 (2014); Neal, J. A., et al., "Enhancing mechanical performance of a covalent self-healing material by sacrificial noncovalent bonds", J. Am. Chem. Soc., 137, 4846-4850 (2015); Grindy, S. C. et al., "Control of hierarchical polymer mechanics with bioinspired metal-coordination dynamics", Nature Mater, 14, 1210-1216 (2015); and Li, C.-H. et al., "A highly stretchable autonomous self-healing elastomer", Nature Chem., 8, 618-624 (2016), each of which is hereby incorporated by reference in its entirety for their teachings. The stretchable and self-healing polymer films can exhibit strain maximum strain of between 200-3,000 percent and/or 600-3,000 percent in some embodiments (which is also the fracture strain), fracture energy of 12,000-15,000 J/m$^2$, self-healing efficiencies of 80-100 percent at room temperature for three to forty-eight hours, and/or greater efficiencies at higher temperatures in some embodiments.

Various embodiments include the use of a self-healing electrode, which can be used to form one or more of the different modular electronics. The self-healing electrode can be formed by using the flexible and self-healing polymer. For example, and as further described herein, the electrode can be formed using a first layer of polymer film and patterning a metal thereon (e.g., liquid metal alloy (EGaIn)). The metal can be encapsulated in the polymer by subsequently bonding another layer of polymer film on the first layer of polymer film. The bonding process can involves annealing at room temperature for a period of time (e.g., six hours) after applying gentle pressure to keep the two pieces in good contact.

A number of embodiments are directed to methods of forming the above-described apparatuses. An example method includes placing a first electronic circuit in contact with a second electronic circuit, wherein each of the first and second electronic circuits have connector circuits that provide an electrical connection between the first and second electronic circuits and are formed with a polymer film that is configured to adhere, via self-healing, to another polymer film. The method further includes, in response to the contact, causing the respective polymer films of the first and second electronic circuits to self-heal by facilitating this self-healing in an appropriate environment to create the electrical connection therebetween. This self-healing can be with or without pressure applied to the first and second circuits and/or can be at room temperature, and with the electrical connection being formed without soldering or use of conductive adhesives. For example, the self-healing can involve or include applying force on the connecting side of the first and second electronic circuits relative to the connector circuits, the connector circuits including conductive lines formed on a layer of the polymer film. In various embodiments, the self-healing can include placing the first electronic circuit in contact with the second electronic circuit for a period of time and without the application of force on either connecting side, thereby creating the electrical connection. In some specific embodiments, the self-healing is in the presence of liquid, such as water or sweat. The polymer film can include the previously described self-healing and flexible polymer film. Additionally, electrical connections between a plurality of electronic circuits, including the first and second electronic circuits and at least one additional electronic circuit, via self-healing of respective polymer films and/or to form a three-dimensional structure with the plurality of electronic circuits.

The method can further include disconnecting the first electronic circuit and the second electronic circuit via cutting of the respective connector circuits. For example, self-healing of the respective polymer films of the first and second electronic circuits can additional occur, thereby creating a different electrical connection and resulting in a different configuration.

Related and more-specific embodiments are directed to a method of forming an apparatus that includes placing a plurality of flexible electronic circuits in contact with another of the plurality of electronic circuits. As previously described, each of the plurality of electronic circuits have embedded connector circuits having conductive lines that provide electrical connection between and which are formed with a polymer film that is configured to adhere, via self-healing, to another polymer film. In response to the contact, the method further includes bonding adjacent electronic circuits by causing or facilitating the self-healing of the respective polymer films of the connector circuits, and thereby creating the electrical connection between respective conductive lines. In various specific embodiments, the electronic circuits include printed electronics formed on a layer of the self-healing and flexible polymer film and the connector circuits include conductive lines formed on a layer of the self-healing and flexible polymer film. The bonding can occur in the presence of liquid and/or while the apparatus is in use, such as self-healing of a wearable device while a user is wearing the device and sweating.

Turning now to the figures, FIG. 1A illustrates an example of different modular electronics and an assembly thereof, in accordance with various embodiments. As previously described, the modular electronics can include a variety of different electronic circuits 102, 104, 106 and connector circuits 103, 105, 107, 109. Each component can be formed of a self-healing and flexible polymer film such that the components can be assembled into an apparatus. As the components are able to self-heal, the modular electronic components provide modularity, can be exchanged by cutting and reconnecting the self-healable interconnects, provide flexibility, stretchability, mechanical durability and self-healability, and can be used to form complex two dimensional (2D) and three dimensional (3D) device integration (as further illustrated herein). The polymer film (e.g., the self-healing and flexible polymer film) can contain a conductive material on a surface or inside, such as carbon nanotubes, silver nanowires, metallic nanowire, silver flakes, metallic flakes, silver particles, and/or metallic particles.

As illustrated by FIG. 1A, the left side of the figure illustrates the different modular electronic components 102, 103, 104, 105, 106, 107, 109 when not assembled and the right side illustrates an assembly 100. The modular electronic components include a variety of different electronic circuits 102, 104, 106 and connector circuits 103, 105, 107, 109. The electronic circuits 102, 104, 106 include printed electronics formed on a layer of self-healing and flexible polymer film. The electronic circuits 102, 104, 106 can provide different functions, such as sensing functions, processing functions, communication functions, etc. For example, the electronic circuits 102, 104, 106 can include sensors, such as temperature sensors, atmospheric sensors, pressure sensors, pH sensors, chemical sensors, light sources (e.g., a light emitting diode), microcontroller, communication circuits, etc. The connector circuits 103, 105, 107, 109 can include conductive lines formed on a layer of self-healing and flexible polymer film. The conductive lines can be formed of a variety of different conductive material, such as liquid ink, PEDOT PSS, silver nanowires, metal/nanoparticles. The electronic circuits and connector circuits 103, 105, 107, 109 can have a variety of different geometries (e.g. height, width) of channels, encapsulation thickness, stiffness, and variety of different external surface treatments (e.g., sticky, non-stick, roughness, micro-pillars). As illustrated by FIG. 1A, the connector circuits 103, 105, 107, 109 can be embedded in the electronic circuits 102, 104, 106. As the connector circuits 103, 105, 107, 109 form part of the electronic circuits 102, 104, 106, two or more electronic circuits 102, 104, 106 can be connected to one another directly via the respective embedded connector circuits 103, 105, 107, 109. Although FIG. 1A illustrates the electronic circuits 102, 104, 106 as having one or two embedded connector circuits, embodiments are not so limited. For example, connector circuits can be embedded on each surface (e.g., four in the illustrated example) and/or subsets of surfaces of the electronic circuits 102, 104, 106.

The electronic circuits 102, 104, 106 can be placed in contact with one another, and self-heal together to form electrical connections via the embedded connector circuits 103, 105, 107, 109. The resulting assembly 100, such as illustrated by the left side of FIG. 1A, can be later disassembled and reconnected in different configurations. In specific aspects, the resistance of the conductive polymer connection is less than 1 kohm, less than 100 ohm, or less than 10 ohm.

Although the embodiment of FIG. 1A illustrates the connector circuits 103, 105, 107, 109 being embedded in the electronic circuits 102, 104, 106 and the different electronic circuits directly connecting via the embedded connector circuits 103, 105, 107, 109, embodiments are not so limited. For example, alternatively and/or in addition, separate connector circuits can be used. A separate connector circuit can be formed independently from the electronic circuit and is not embedded in the electronic circuit.

Figure 1B:
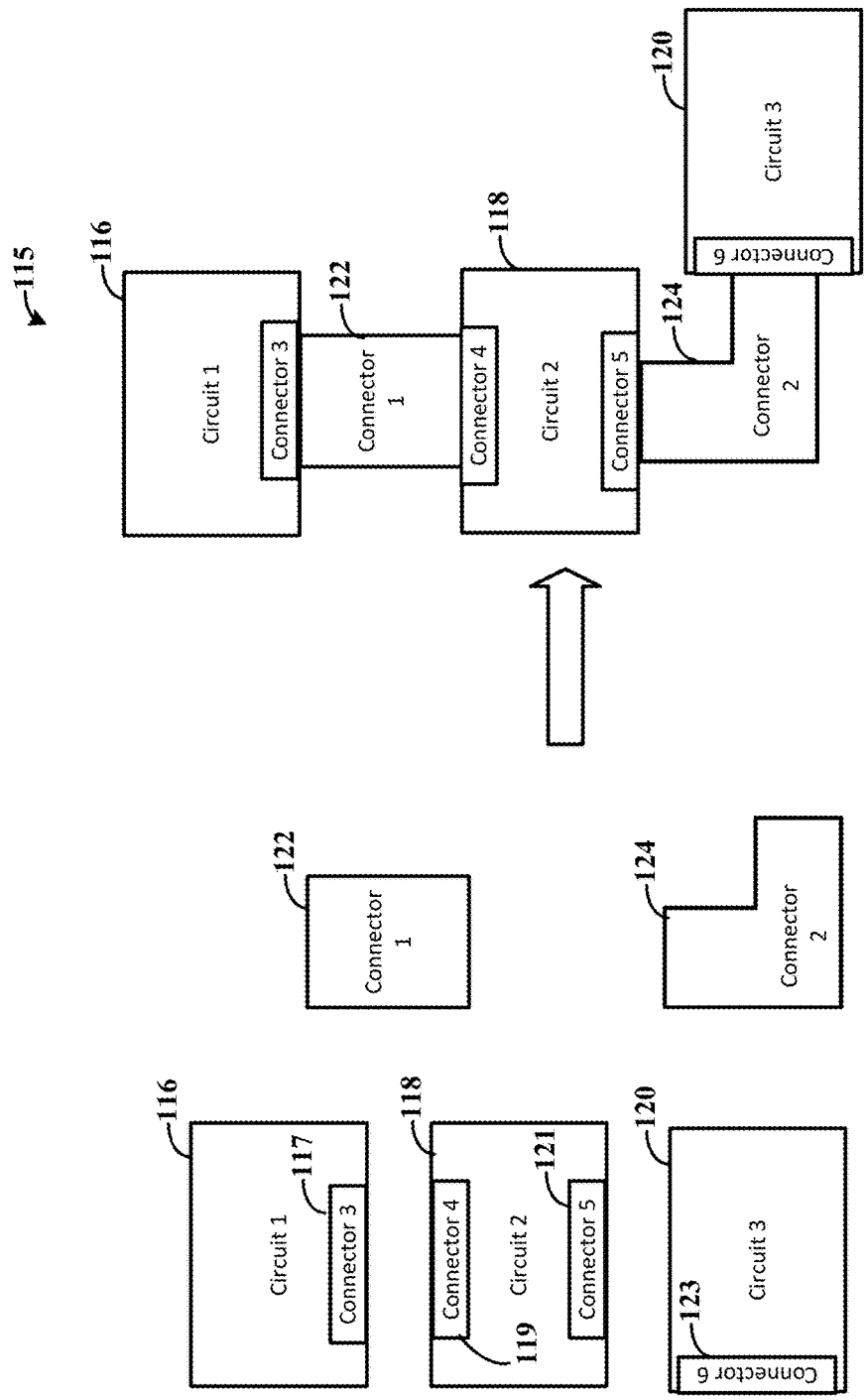

FIG. 1B illustrates another example of electronic circuits and connector circuits. Similarly to FIG. 1A, the left side of the figure illustrates the different modular electronic components when not assembled and the right side illustrates an assembly 115. As described above, separate connector circuits 122, 124 can be used to connect electronic circuits 116, 118, 120 in a variety of shapes. The separate connector circuits 122, 124 can be different lengths and shapes. For example, the separate connector circuits 122, 124 can be used to provide different distances between electronic circuits 116, 118, 120, different shaped assemblies, three-dimensional assemblies, and circular assemblies, among other shapes. The separate connector circuits 122, 124 can be linear, angled at different degrees (e.g., ninety degree turns, seventy-five degree turn, thirty-degree turn, among other degrees), curved (e.g., form a circle or other turn in a smooth degree), and/or can turn in a Z-direction (e.g., to form three-dimensional assemblies), among other orientations. In some embodiments, one or more of the electronic circuits 116, 118, 120 can include embedded connector circuits 117, 119, 121, 123 which are used to form electrical connections with another electronic circuit via an embedded connector circuit or with a separate connector circuit 122, 124 therebetween. For example, the electronic circuits can be placed in contact with a connector circuit, and self-heal together (e.g., the separate connector circuit heals to the embedded connector circuit) to form electrical connections via the embedded connector circuits. The assembly 115, such as illustrated by the left side of FIG. 1B, can be later disassembled and reconnected in different configurations.

FIG. 1C illustrates a side view of an example electronic circuit as illustrated by FIGS. 1A and/or 1B, in accordance with various embodiments. The electronic circuits can be formed of a printed circuit having a particular functionality. The printed electronic circuit 130 (e.g., printed circuit board (PCB)) can be printed on a flexible polyamide island and subsequently placed on a layer of self-healing and flexible polymer film. As illustrated by FIG. 1C, the printed electronic circuit 130 can be between two layers of the self-healing and flexible polymer film, e.g., can be embedded between layers of the self-healing and flexible polymer film.

FIG. 1D illustrates a side view and FIG. 1E illustrates a top down view of an example connector circuit as illustrated by FIGS. 1A and/or 1B, in accordance with various embodiments. As illustrated the connector circuits 140, 150, whether embedded in an electronic circuit and/or separate, include a plurality of conductive lines formed on a layer of self-healing and flexible polymer film. In various embodiments, as illustrated by FIG. 1D, the conductive lines can be between two layers of the self-healing and flexible polymer film, e.g., can be embedded between layers of the self-healing and flexible polymer film. The conductive lines can be used to electrically connect the electronic circuits. For example, the electronic circuits are prepared that have conductive lines (e.g., the embedded connector circuits having the same number as the connectors) on each side of the circuit, and the conductive lines of the electronic circuits connect to the conductive lines of the connector circuit(s) and/or the conductive lines of the embedded connector circuit of another electronic circuit after self-healing occurs.

FIG. 1F illustrates an example of an electronic circuit with an embedded connector circuit, in accordance with various embodiments. As illustrated, the embedded connector circuit includes the plurality of conductive lines formed on a layer of self-healing and flexible polymer film, as described above. In various embodiments, the electronic circuit 160 can be directly connected to another electronic circuit via the embedded connector circuit in each respective electronic circuit. Alternatively, the electronic circuit 160 can be indirectly connected to the other electronic circuit via a separate connector circuit that connects to each embedded connector circuit.

FIGS. 2A-2D illustrate an example of an assembly, in accordance with various embodiments. In accordance with various embodiments, electronic modules are fabricated on polyimide film and are encapsulated by the self-healing and flexible elastomer material. Stretchable self-healing connectors are formed using liquid metal EGaIn on tough self-healing film. Both 2D and 3D structures can be fabricated and reconfigured.

As illustrated, a plurality of modular electronics are assembled into an apparatus. In the particular example illustrated by FIG. 2A, the apparatus forms an S-shape. The apparatus can include an I$^2$C digital communication based wearable device that provides a plurality of functionalities. Prior to assembly (and/or after in response to a disassembly process) the different modular electronics include separated electronic circuits which may or may not have embedded connector circuits, and optionally, separate connector circuits.

In the specific embodiments and as illustrated by FIG. 2B, an altitude and temperature sensing printed electronic circuit is generated on a flexible PI (Polyimide) islands and subsequently placed on tough self-healing film (PDMS-MPU$_{0.4}$-IU$_{0.6}$), respectively. As illustrated by FIG. 2C, 2 mm width, electrical-communication, conductive lines can be created for each module, using a self-healing conductor. The connector circuit illustrated by FIG. 2C can be embedded in the electronic circuit illustrated by FIG. 2B.

The two electronic circuits on the self-healing substrate can be linearly connected with a room temperature bonding process for the conductive lines. Resultant, electronic devices can provide a plurality of functionalities, such as simultaneously sensing atmospheric pressure change and temperature change based on I$^2$C digital communication (see, e.g., FIGS. 7C-7D). As further illustrated herein, to highlight the modularity of a stretchable wearable electronic system formed using modular electronics, five electronic circuits are prepared that have four conductive lines at each end and multiple connectors with various structures shown in FIG. 8.

Figure 2D:
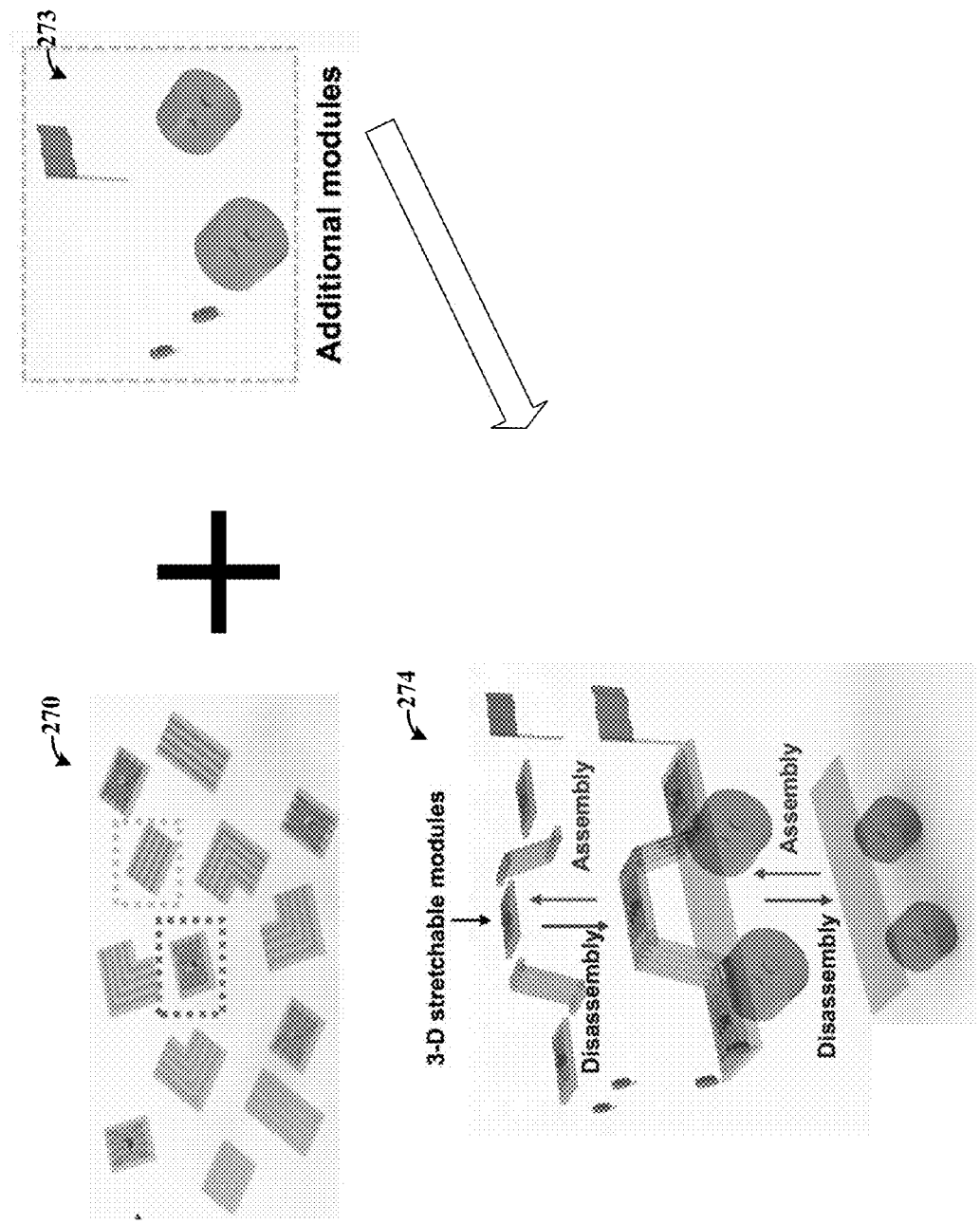

In various specific experimental embodiments, through repeating the room temperature bonding and cutting process of the connectors and/or electronic circuits, complex 2D and 3D device structures with good flexibility and stretchability. As illustrated by FIG. 2D, the modular electronics, as illustrated by 270, with the addition of other components, examples of which are illustrated by 273 (e.g., such as the wheels), can be used to assemble 3D structures (see, also FIGS. 8, 9 and 10A-10B), such as assembly the 3D structure illustrated by the process 274. Such technology is applicable to other digital communication protocols such as Non-return to Zero (NRZ) that is utilized in wearable and Internet of things applications.

Figure 11A:
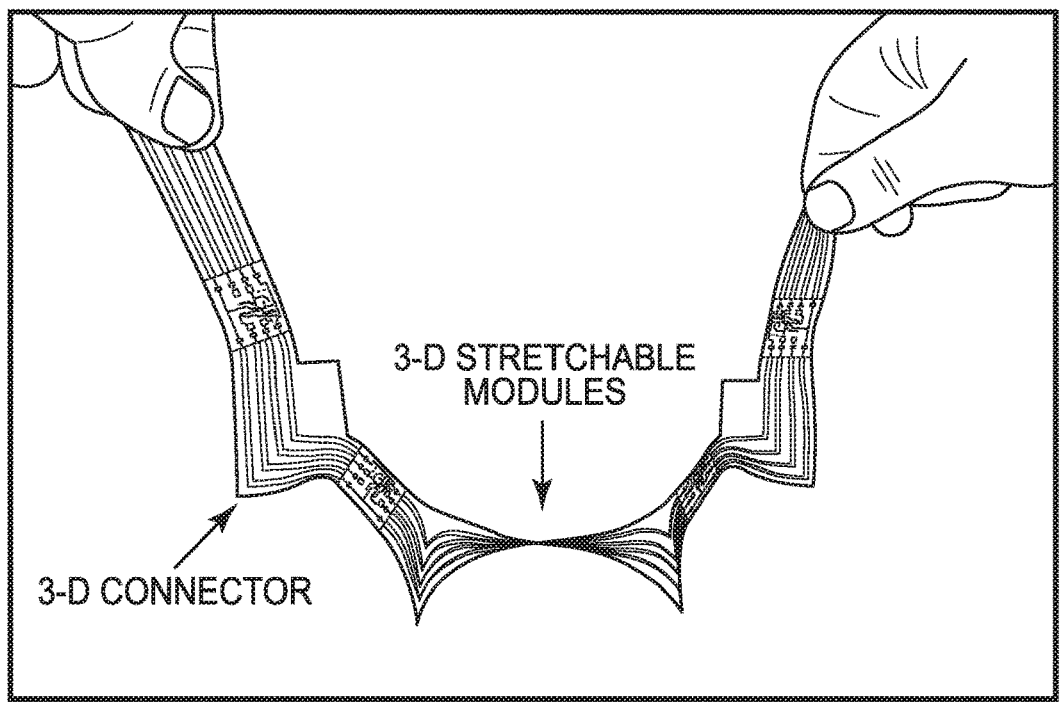
FIGS. 11A-11B illustrate optical images of different assembled modular electronic device using connector circuits and optionally using additional modular component, in accordance with various embodiments.
Figure 11B:
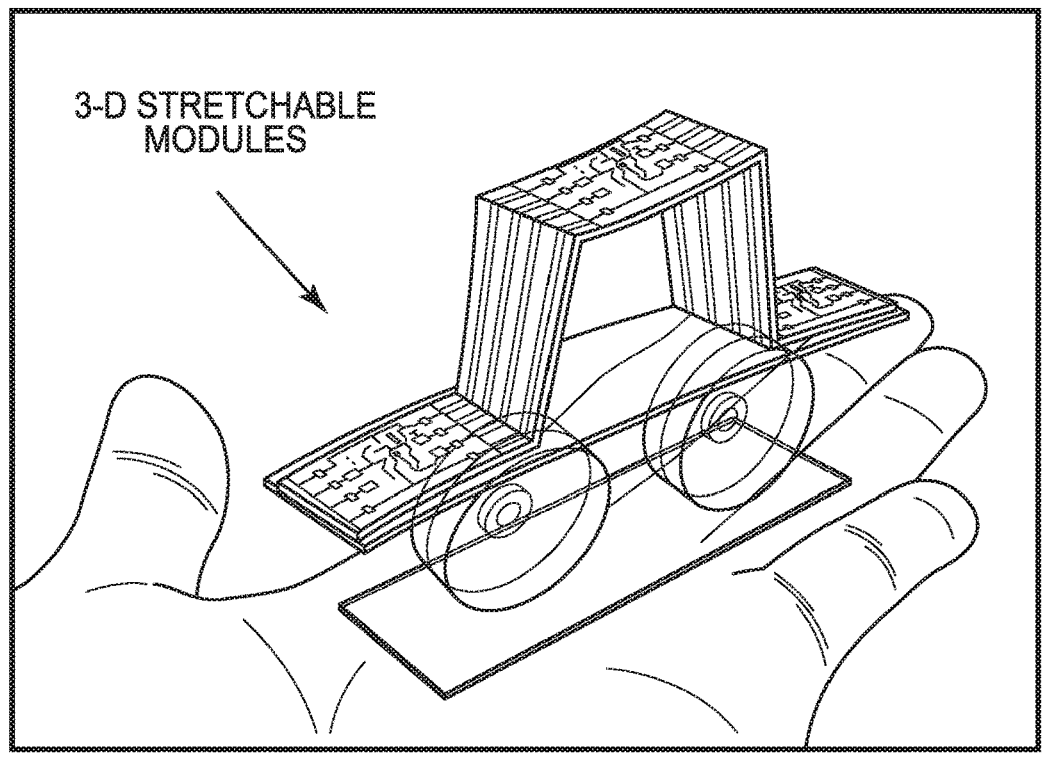

In a specific experimental embodiment, five RGB (red, green, blue) LED chips are prepared with the control integrated circuit (IC) on PI island and self-healing film, respectively (see, e.g., FIGS. 11A-11B). In contrast with I$^2$C based devices, NRZ uses three conductive lines for electrical communication. Each of the five RGB LED modules on the self-healing substrate are linearly connected, as further illustrated herein. The light intensity and color of each LED chips can be simultaneously and individually controlled by a microcontroller (Arduino/Genuino Uno) even under stretching. The sequence of the LED modules can be easily reconfigured by cutting the device and reconnecting at will, while any configuration or device structures can be easily created by introducing additional connectors (see, e.g., FIG. 12). This can mitigate the obstacles set by conventional printed circuit board electronic modules and connectors and empower them to dive into the iterative process of designing and creating customizable and personalized wearable devices that are fully compliant with their bodies and related social norms.

Figure 3A:
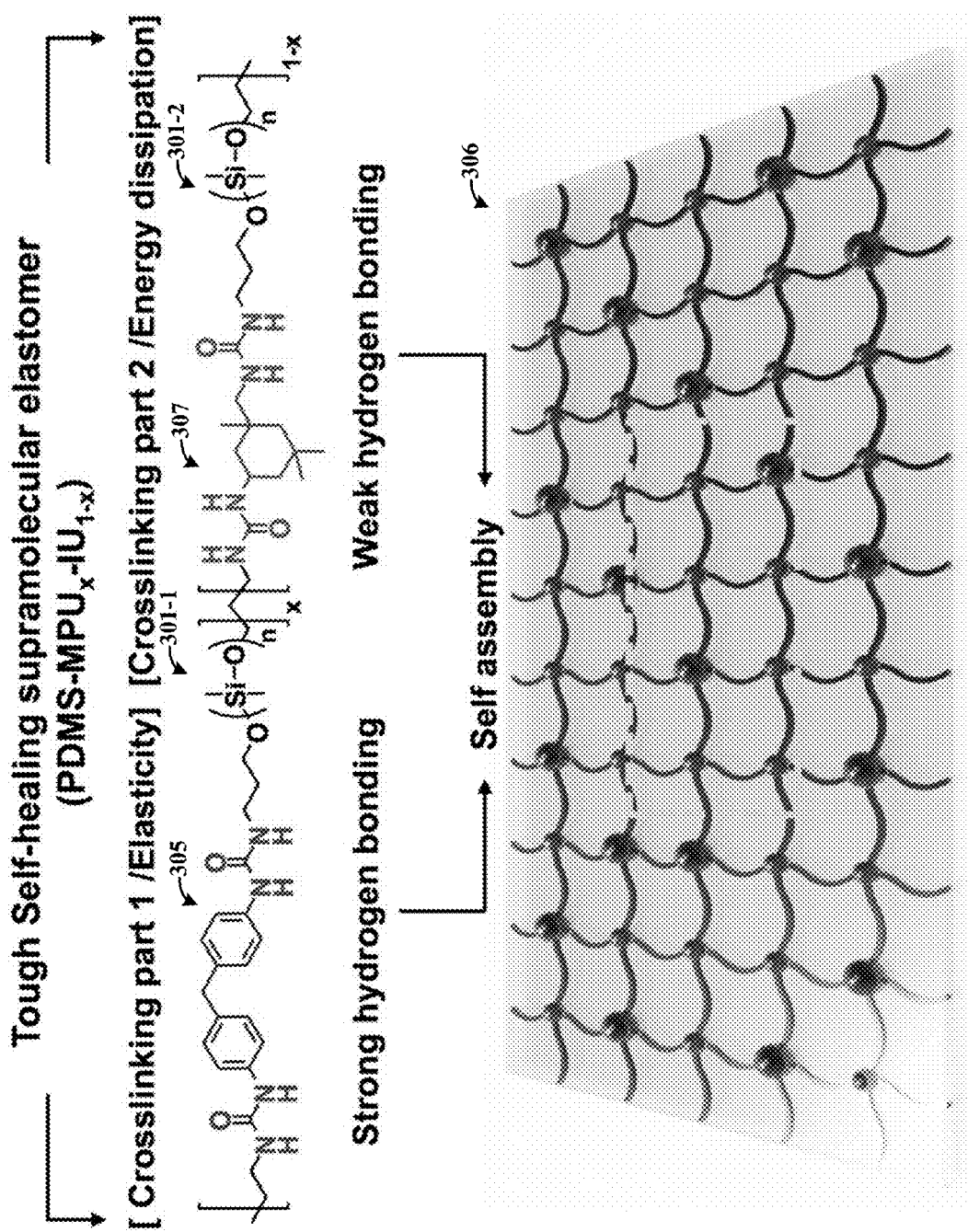
FIGS. 3A-3B shows an example of an elastomer material and the supramolecular network formed as a polymer film from the elastomer material, in accordance with various embodiments.
Figure 3B:
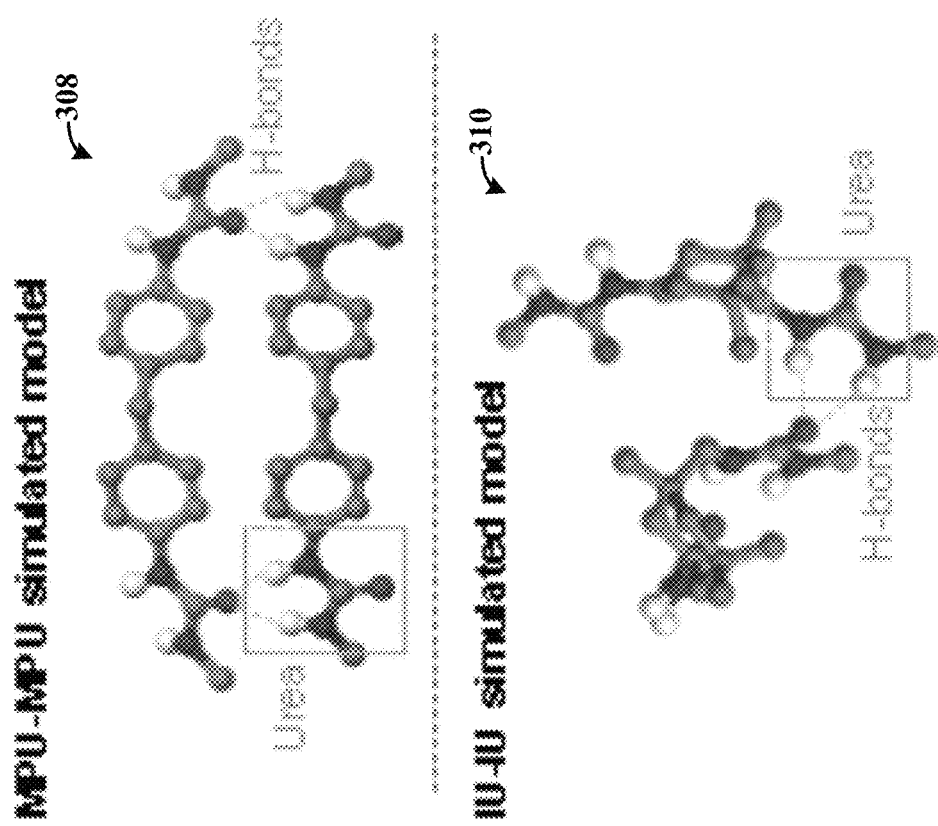

FIGS. 3A-3B show an example of an elastomer material and the supramolecular network formed as a polymer film from the elastomer material, consistent with embodiments of the present disclosure. As previously described, the elastomer material can include a supramolecular network formed as a polymer film 306 and that realizes autonomous self-healing, stretching, and is tough. The elastomer material includes a polydimethylsiloxane (PDMS) polymer 301-1, 301-2 with a particular ratio of MPU and IU units 305, 307. In specific embodiments, the ratio of MPU and IU units 305, 307 can be adjusted, as further illustrated herein. Although embodiments are not so limited and can include a variety of different flexible polymer backbones, and different units that provide the different crosslink strengths, as further illustrated herein.

More specifically, FIG. 3A illustrates the chemical structure of PDMS-MPUx-IU1-x and the supramolecular structure therein. It is believed that the mechanical properties of the elastomer material (e.g., PDMS-MPUx-IU1-x) is due to the different crosslink strength of MPU and IU. The MPU and IU units 305, 307 can provide different strength crosslinking dynamic bonding. As an example, a first number of dynamic (e.g., hydrogen) bonds can result from MPU-MPU interactions and a second number of dynamic (e.g., hydrogen) bonds can result from IU-IU interactions.

A particular embodiment of elastomer material includes a PDMS-MPU$_{0.4}$-IU$_{0.6}$ film which includes a ratio of MPU units to IU units of 0.4 to 0.6. In an experimental embodiment, the PDMS-MPU$_{0.4}$-IU$_{0.6}$ film can dissipate strain energy efficiently. If the polymer film is first allowed to rest for 30 minutes and stretched again, the stress-strain curves can recover completely. Surprisingly, the PDMS-MPU$_{0.4}$-IU$_{0.6}$ film exhibits notch-insensitive stretching and a high fracture energy (around 12,000 J/m2) among reported intrinsically tough materials as well as self-healing polymers.

The mechanical properties of PDMS-MPU-IU can depend on the ratio of MPU and IU units 305, 307. In various experimental embodiments, when the ratio of MPU units in the polymer film is decreased, the fracture strain of the polymer film is increased, and the Young's modulus and fracture energy are decreased (see, e.g., Table 1). For high mechanical strength, a higher MPU-MPU crosslinking density is used. It is believed that the formation of the supramolecular structure in the polymer film is driven by the combination of stronger MPU-MPU bonds, and the weaker MPU-IU or IU-IU bonds.

In other specific experimental embodiments, in CHCl$_3$ solution, the MPU units are observed to interact primarily with the MPU unit rather than the IU unit, which can be confirmed by both concentration dependent viscosity measurements and nuclear magnetic resonance (NMR) measurements. Such a pre-crosslinked polymer network by MPU-MPU interactions in $CHCl_3$ solution gives rise to a supramolecular structure in polymer film with both strong bonds and weak bonds upon removal of the solvent. The resulting supramolecular structure is stretchable and has a high fracture energy (see, e.g., FIG. 4A). When a notched sample is stretched, the strong bonds are believed to be sufficient to block the induced crack propagation while the weak bonds simultaneously break and dissipate strain energy. It is believed that the breakage of the weak bonds is able to reduce the stress concentration on the strong bonds in the notch (see, e.g., FIG. 4C). Moreover, since the MPU and IU units are covalently linked by flexible PDMS, the above process can synergistically take place.

Accordingly, the illustrated elastomer material can be used to form a polymer film that is self-healing, tough, and stretchable. The polymer film is capable of autonomous self-healing even when immersed in water. As a specific example and further illustrated herein, it is observed that the scar on a cut polymer film ($PDMS-MPU_{0.4}-IU_{0.6}$) can almost disappear after healing at room temperature for three days. The healed polymer film is again able to be stretched to 1,500 percent with self-healing efficiency of 78 percent. Polymers with lower MPU ratios, such as $PDMS-MPU_{0.2}-IU_{0.8}$ and $PDMS-MPU_{0.3}-IU_{0.7}$, showed faster healing and higher self-healing efficiencies given the same healing time (e.g., see, Table 1). This observed ambient self-healing property can be attributed to the abundant dynamic (e.g., hydrogen) bonds within the elastomer and the low glass transition temperature ($T_g$) (<0° C.) of the PDMS backbone.

As previously described, the self-healing of the elastomer (e.g., $PDMS-MPU_{0.4}-IU_{0.6}$) is water-insensitive. When the severed polymer films is healed in water for 24 hours, the resulting film can be stretched up to 1,100 percent strain. Importantly, there is no significant water uptake into the polymer film. It is believed that the hydrophobicity of the polymer backbone (PDMS) may increase the enthalpy gain for dynamic (e.g., hydrogen) bonding formation, which is responsible for self-healing. The resulting enthalpy gain may exceed entropy gain by hydration of dynamic (e.g., hydrogen) bonding units (which will lead to self-healing failure). Such elastomers can be used for water-insensitive self-healing polymers based on broadly used dynamic (e.g., hydrogen) bonding systems.

The mechanical and self-healing properties of the elastomer material (e.g., $PDMS-MPU_{0.4}-IU_{0.6}$) in accordance with the present disclosure, allows the material to be processed in various ways. Example processing includes solution processing or molding and bonding at elevated temperatures and even room temperature. For example, two sheets of $PDMS-MPU_{0.4}-IU_{0.6}$ films can be bonded together giving mechanical properties similar as the bulk film. Further, $PDMS-MPU_{0.4}-IU_{0.6}$ blocks can be readily attached to $PDMS-MPU_{0.4}-IU_{0.6}$ substrate with robust interface even under large applied biaxial strain. Further, using the elastomer material, 3D self-healable objects can be formed, such as self-healing flower and boat. Moreover, the tough self-healing film can be sutured on soft animal skin surfaces without rupturing. Combing with its self-healing property in water, this material is especially useful as a substrate for attaching electronics onto soft surfaces.

FIG. 3B illustrates a simulated dimer model of MPU-MPU 308 (top) and IU-IU 310 (bottom), respectively. Calculations for example experimental embodiments can be performed with the Gaussian 09 program package, where structural optimizations are carried out at the B3lYP/6-31g (d) level followed by frequency calculation at the same level, affording the structures on the next page with zero imaginary frequencies. For MPU-MPU interaction, a maximum of four hydrogen bonds can form. By contrast, IU can form less four, such as a maximum of two, hydrogen bonds with counter IU. Accordingly, this supports that the MPU-MPU interaction is stronger than IU-IU interaction and imparts elasticity. Particularly, the IU-IU dimer model can be unstable due to its dynamic motion.

Figures 4A, 4B, 4C:
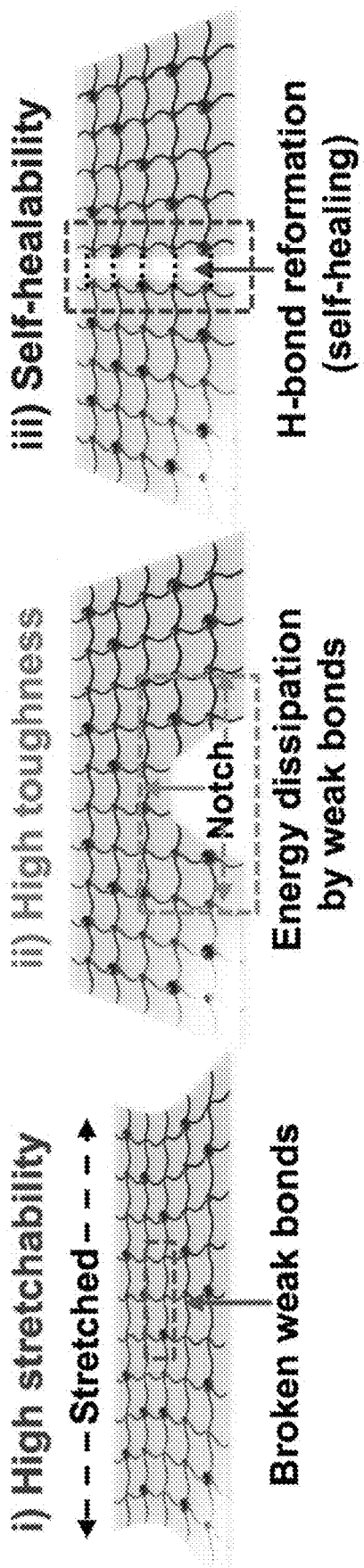
Figure 4D:
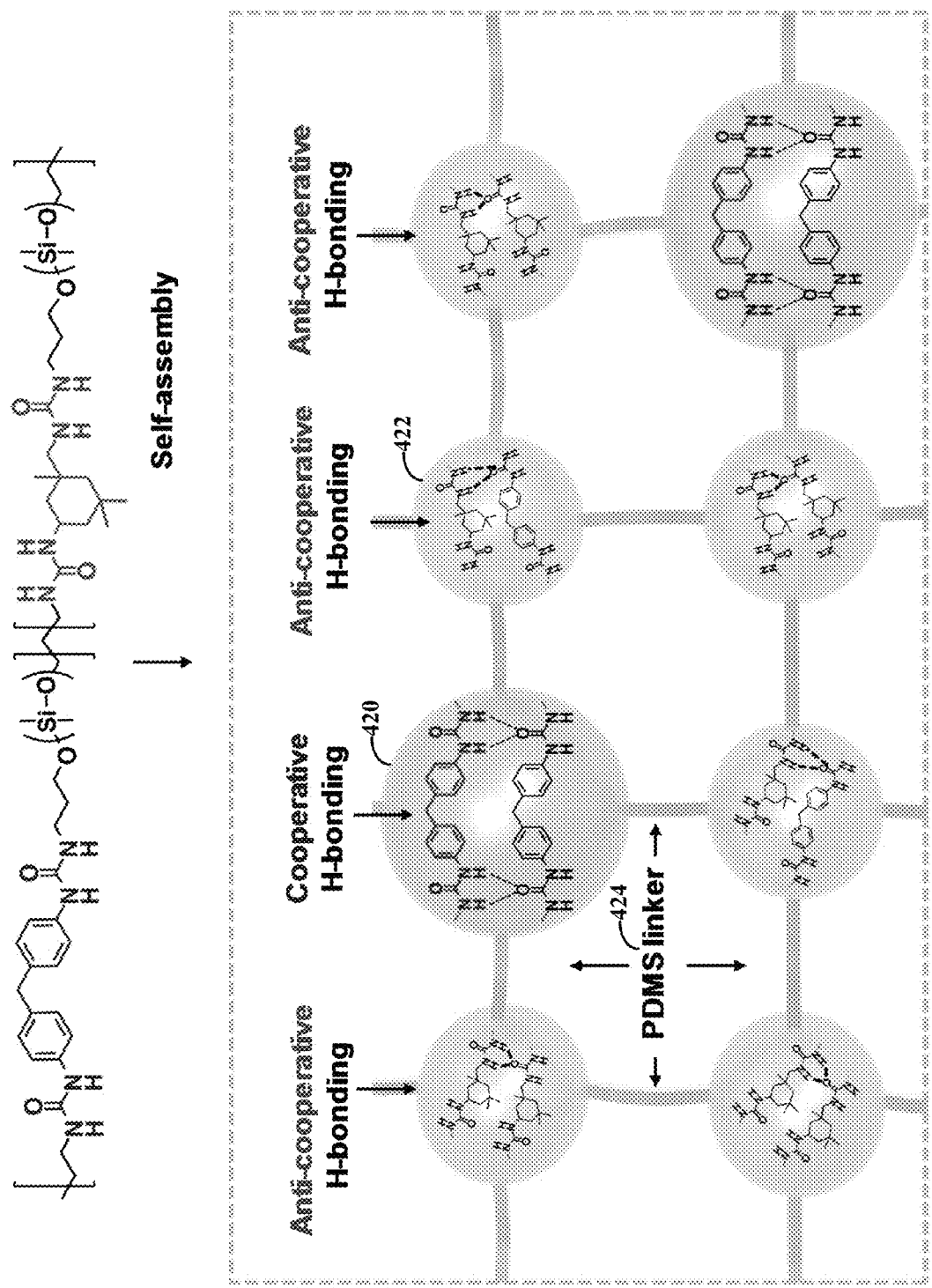

FIGS. 4A-4I illustrate example properties of polymer films formed using the elastomer material, in accordance with various embodiments. FIG. 4A illustrates schematic of a stretched polymer film in accordance with embodiments. FIG. 4B illustrates a notched film (e.g., the toughness of the film) and FIG. 4C illustrates self-healing of the polymer film in accordance with various embodiments. FIG. 4D illustrates example dynamic (e.g., hydrogen) bonding combinations for a strong bond and a weak bond of a polymer film formed of a flexible polymer backbone 424 and a ratio of first and second moieties, such as MPU and IU, respectively. For MPU-MPU interactions 420, a maximum four hydrogen bonds can form. By contrast, IU can form less than four hydrogen bonds, such as a maximum two hydrogen bonds with counter IU. Accordingly, this supports that the MPU-MPU interaction 420 is much stronger than IU-IU interaction 422 and impart elasticity. Particularly, the IU-IU dimer model can be unstable due to its dynamic motion.

The polymer film can have a variety of mechanical properties in accordance with various embodiments. In specific example embodiments, the films can be stretched to sixteen times its original length at a loading rate of 20 mm/min (200 percent/min) without rupturing. In more specific embodiments, the polymer films can be stretched up to 3,000 percent.

The mechanical properties of PDMS-MPU-IU can depend on the ratio of MPU and IU units. In various experimental embodiments, when the ratio of MPU units in the polymer is decreased, the fracture strain of the polymer film is increased but the Young's modulus and fracture energy are decreased (Table 1 below). For example:

TABLE 1

|  | Young's modulus $(MPa)_a$ | Strain at break $(\%)_a$ | Fracture energy $(J/m_2)_b$ | Self-healing Efficiency (%) after 48 $h_c$ |
|---|---|---|---|---|
| PDMS-IU | 0.12 ± 0.03 | NA | NA | NA |
| PDMS-MPU | 0.98 ± 0.13 | 728 ± 104 | 1331 ± 130 | 17 ± 5 |
| $PDMS-MPU_{0.3}-IU_{0.7}$ | 0.43 ± 0.08 | 2182 ± 180 | 5730 ± 190 | 86 ± 8 |
| $PDMS-MPU_{0.4}-IU_{0.6a}$ | 0.62 ± 0.06 | 1735 ± 107 | 11480 ± 710 | 72 ± 12 |
| $PDMS-MPU_{0.5}-IU_{0.5}$ | 0.71 ± 0.11 | 1475 ± 129 | 8803 ± 380 | 41 ± 11 |
| PDMS (Sylgard 184) | 0.41 ± 0.10 | 170 ± 15 | 84 ± 12 | NA |
| Polyurethane (SG80A) | 1.73 ± 0.13 | 710 ± 30 | 2280 ± 410 | NA |
| SEBS | 3.83 ± 0.31 | 330 ± 20 | 1360 ± 200 | NA |

Wherein in the table, the sample size is 5 mm (width), 10 mm (gauge length) and 0.4-0.5 (thickness); Stretching speed: 50 mm/min. For b the sample size is 40 mm (width), 5 mm (gauge length) and 0.4-0.5 (thickness); 20 mm single-edge notch; Stretching speed: 50 mm/min. Self-healing experiments are done at ambient temperature on Teflon substrate. Error bars show standard deviation; sample size n=5. Mechanical properties of PDMS (Sylgard 184), Polyurethane (SG80A) and SEBS are characterized as well. Thermoplastic polyurethane (SG80A) and SEBS films are prepared on OTS-treated substrate from chloroform solution and toluene solution, respectively.

The Young's modulus of the PDMS-MPU film can be measured to be 0.98 MPa from its low-strain region and its strain at break is 750 percent. In contrast, PDMS-IU film is not elastic and can undergo continuous plastic deformation upon applied strain. The MPU units are able to form quadruple hydrogen bonding in a cooperative manner with counter MPU units, whereas the IU units can only form maximum dual hydrogen bonding with another IU unit due to the steric hindrance from the isophorone moieties. The multivalent effect can result in MPU-MPU interaction being much stronger than IU-IU interaction, such that the MPU-MPU cross-linking can better hold the elastomer together to impart elasticity.

In other specific examples, the polymer film can be notch-insensitive. For example, the polymer films, surprisingly, are able to achieve notch-insensitive stretching up to 1200 percent strain, demonstrating its exceptional toughness. Other previously formed and typical PDMS substrates rupture at less than 200 percent strain (Table 1). The MPU units are able to form quadruple hydrogen bonding in a cooperative manner with counter MPU units whereas the IU units can only form maximum dual hydrogen bonding with another IU unit due to the steric hindrance from the isophorone moieties. Notch-insensitivity, as used herein, can include or refer to stretching of a polymer film having a notch.

As previously described, a variety of different flexible polymer backbones and different types of bonding units can be used. Example flexible polymer backbones include polydimethylsiloxane (PDMS) polyethyleneoxide (PEO), Perfluoropolyether (PFPE), polybutylene (PB), poly(ethylene-co-1-butylene), poly(butadiene), hydrogenated poly(butadiene), polybutylene, poly(ethylene oxide)-poly(propylene oxide) block copolymer or random copolymer, and poly(hydroxyalkanoate). As may be appreciated, dynamic bonds include or refer to bonding that can be reformed, once broken due to mechanical forces, at room temperature or elevated temperature, such as hydrogen bonding, metal-ligand bonding, guest-host interaction, and supramolecular interaction. Embodiments are not limited to two types of moieties, and can include polymer backbones having more than two moieties. The at least first moieties and second moieties can be spaced randomly or equally from another. For example, the polymer segment between the moieties can typically be between 1,000 Dalton to 25,000 Dalton, although embodiments are not so limited.

Figure 4E:
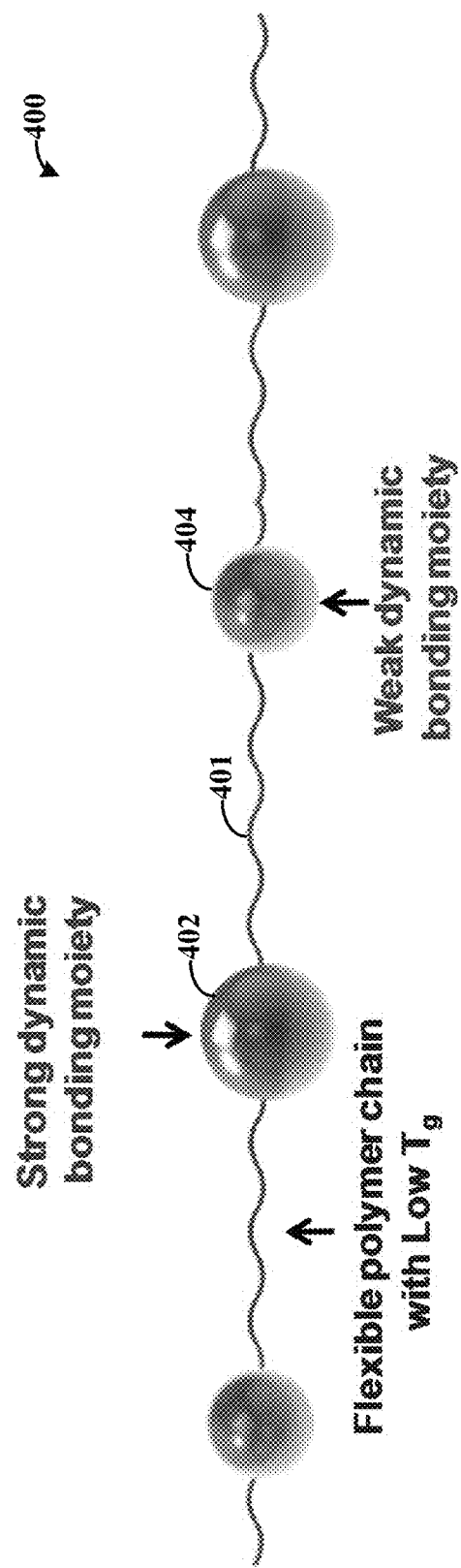

FIG. 4E illustrates an example design of an elastomer material 400. As illustrated, the elastomer material 400 includes a flexible polymer backbone 401 with a low glass transition temperature (Tg). As used herein, low Tg can include or refer to Tg values that are less zero degrees Celsius (C). The elastomer material 400 include a particular ratio of at least a first moiety 402 (e.g., strong dynamic bonding moiety) and a second moiety 404 (e.g., weak dynamic bonding moiety) having a weaker crosslink strength than the first moiety 402.

Figure 4F:
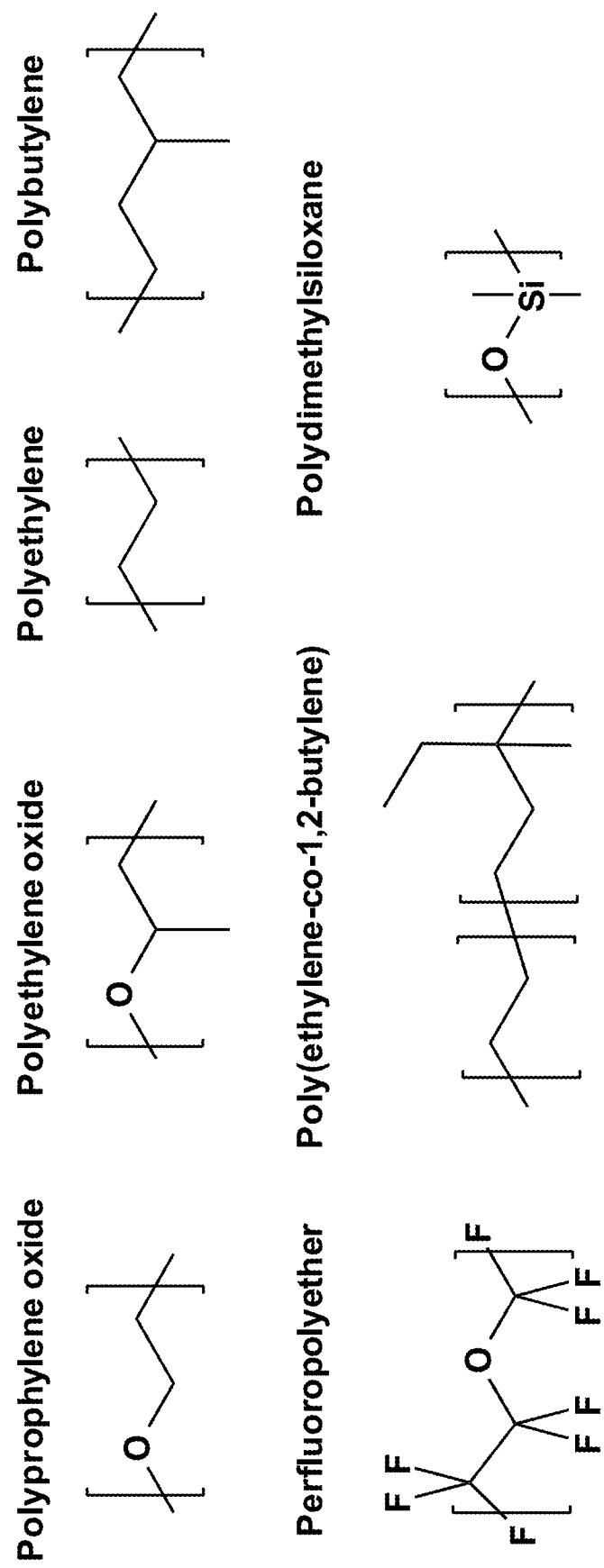

FIG. 4F illustrates examples of different types of flexible polymer backbones. As illustrated, the polymer backbone can include PDMS, PEO, Polyethylene, PFPE, PB, poly(ethylene-co-1-butylene), Polydimethylsiloxane, poly(butadiene), hydrogenated poly(butadiene), polybutylene, poly(ethylene oxide)-poly(propylene oxide) block copolymer or random copolymer, and/or poly(hydroxyalkanoate), among other types of polymer backbones.

Figure 4G:
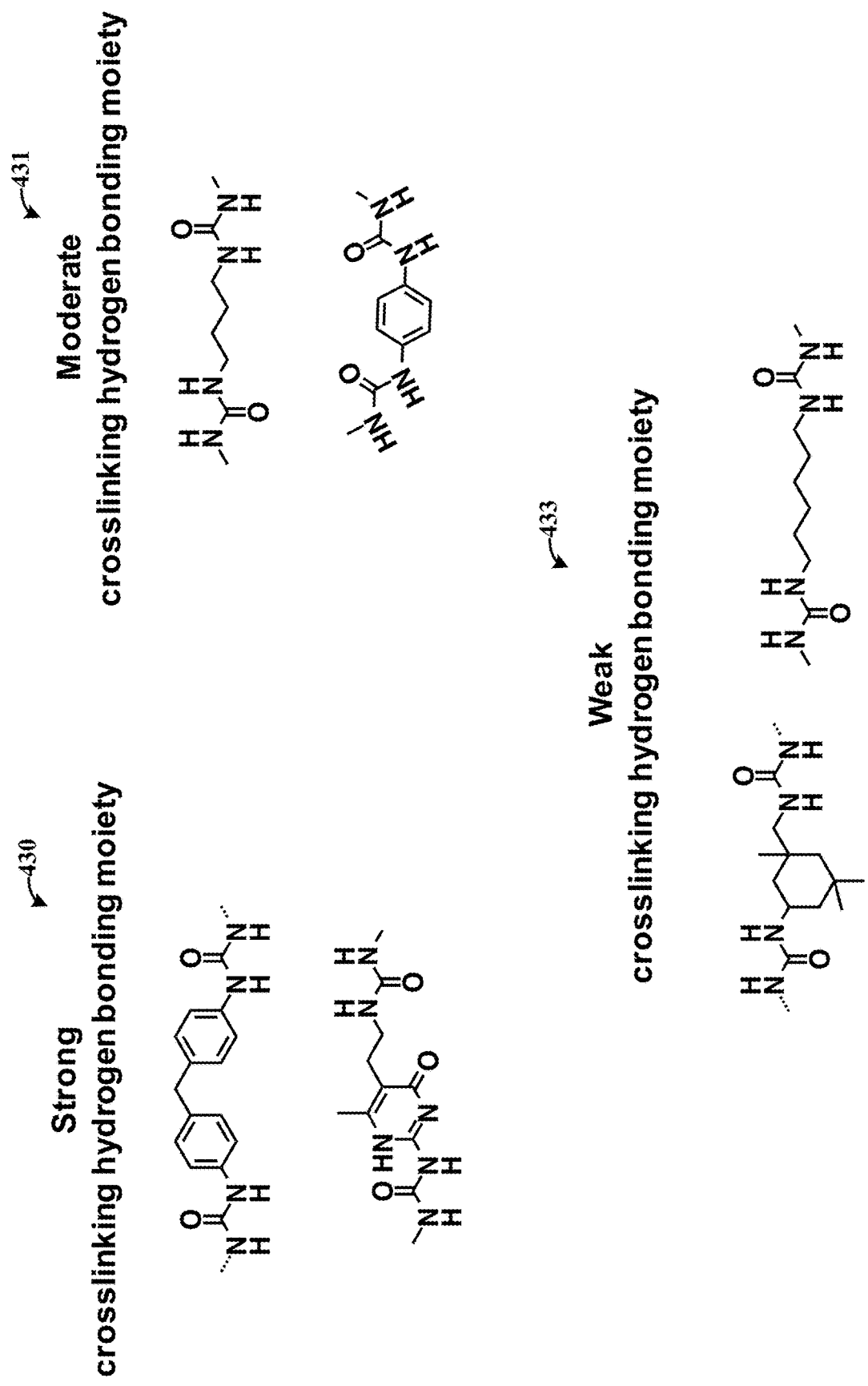

FIG. 4G illustrates different types of moieties, which can also be referred to as bonding sites. The different moieties 430, 431, 433 can have different strength cross-linking.

A number of embodiments are directed to a polymer films formed of a flexible polymer backbone (with low transition temperature) having a particular ratio of at least a first moiety (e.g., strong bonding/crosslinking) and a second moieties (e.g., weak bonding/crosslinking) that has a lower bonding strength than the first moieties. In various embodiments, the polymer backbone has more than two moieties, such as three moieties. At least two of the moieties (or all three) exhibit different bonding strengths. The polymer backbone can include PDMS, PEO, PFPE, PB, poly(ethylene-co-1-butylene), poly(butadiene), hydrogenated poly(butadiene), polybutylene, poly(ethylene oxide)-poly(propylene oxide) block copolymer or random copolymer, poly(hydroxyalkanoate), among other types of flexible polymer backbones. The resulting polymer film can be stretchable, self-healable, and mechanically tough. For example, the polymer film can exhibit a Young's Module that is tunable from 0.1 MPa to 3.0 MPa (and in specific embodiments, from 0.1 to 1.5 MPa). The stretching range of the polymer film when un-notched can have a strain at break of up to 3,000 percent (which is also the fracture strain) and when notched can have a strain at break of up to 2,000 percent. The fracture energy can be up to 15,000 $J/m^2$. In some embodiments, the first moieties can have a crosslinking strength that is at least two times higher than a cross-linking strength of the second moieties. For example, the strength of MPU-MPU is at least two times higher than that of IU-IU since MPU-MPU has two more H-bonds than IU-IU. The transmittance of the polymer film can be at least (or around) 98 percent in the range of 400 nm-1000 nm. The self-healing efficiency of the polymer film can depend on healing temperature and time. At 25° C., as an example, self-healing efficiency can be reached to 75 percent after 48 hours. At 60° C., self-healing efficiency can be reached to almost 100 percent after 6 hours.

Although embodiments are not limited to the above described polymer film and can include a variety of self-healing and flexible polymer films, and different types of moieties. For example, one or more of the moieties can form dynamic bonds other than hydrogen bonding, such as metal-ligand bonding, guest-host interactions, and/or supramolecular interactions.

Figure 4H:
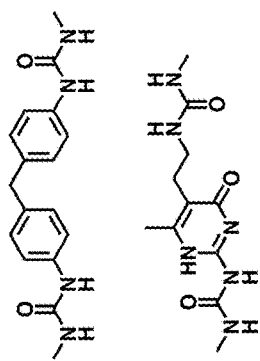
Figure 4H:
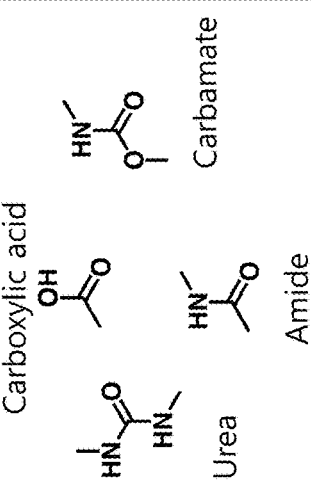
Figure 4H:
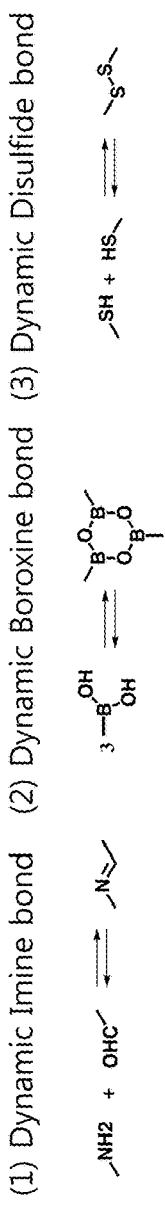
Figure 4H:

FIG. 4H illustrates examples of different moieties and dynamic bonding, in accordance with various embodiments. The dynamic bonding can be covalent or non-covalent, such as hydrogen bonding, metal-ligand bonding, guest-host interaction, and supramolecular interaction.

FIG. 4I illustrates examples of different moieties and tuning of respective dynamic bonding strength, in accordance with various embodiments. In accordance with various embodiments, the polymer backbone can include three or more different moieties. In specific embodiments, the three (or more) moieties can be selected from those illustrated by FIGS. 4D, 4G, and 4H-4I. At least two of the three or more different moieties have the different crosslinking dynamic bonding strength. The third (or more) moieties can have a similar crosslinking dynamic bonding strength as one of the first or second moieties or a different strength, such as a bonding strength that is between the bonding strength of the first moieties and the second moieties.

Figure 5A:
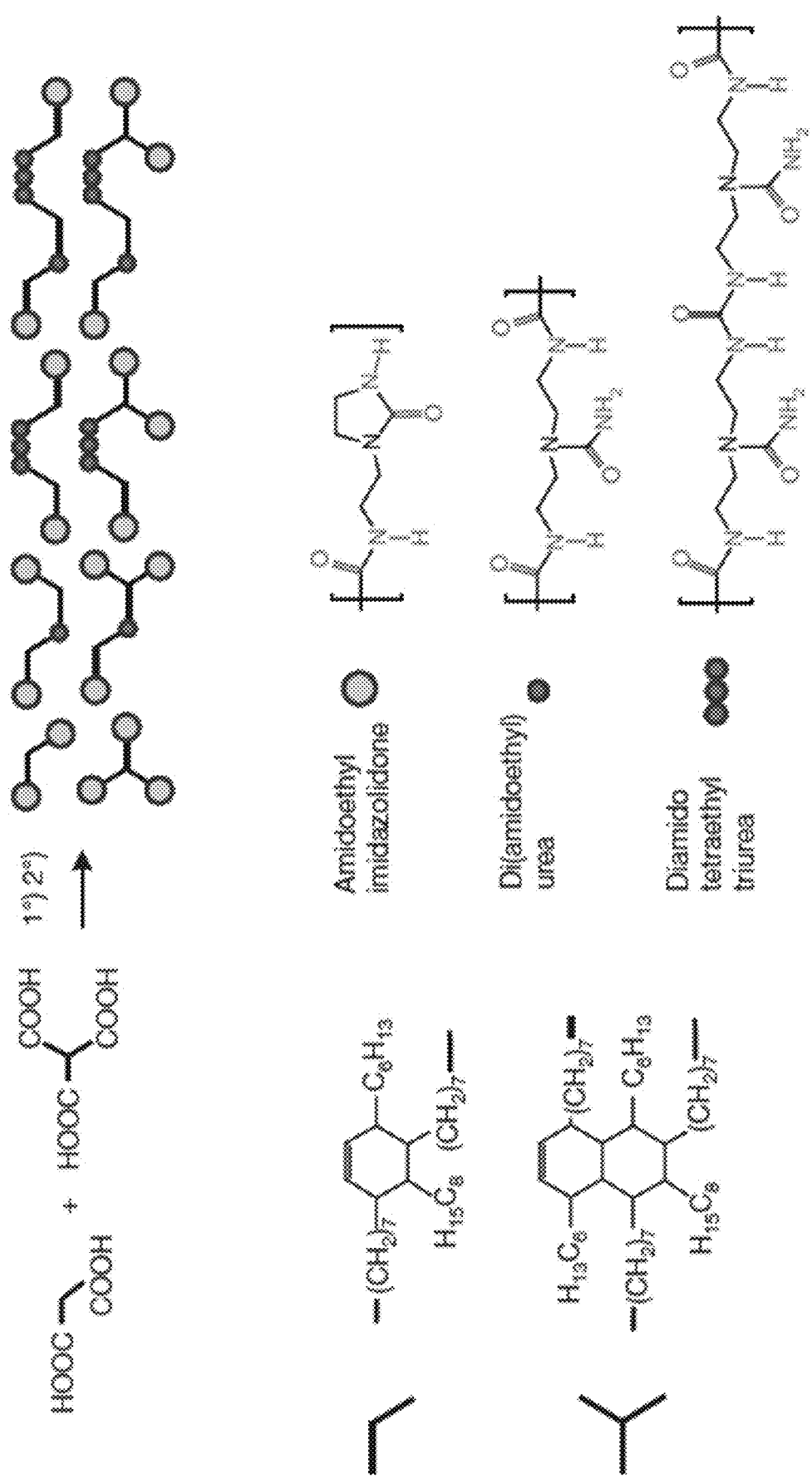
FIGS. 5A-5C illustrate examples of elastomer material used to form the electronic circuits and/or connector circuits, in accordance with various embodiments.
Figure 5B:
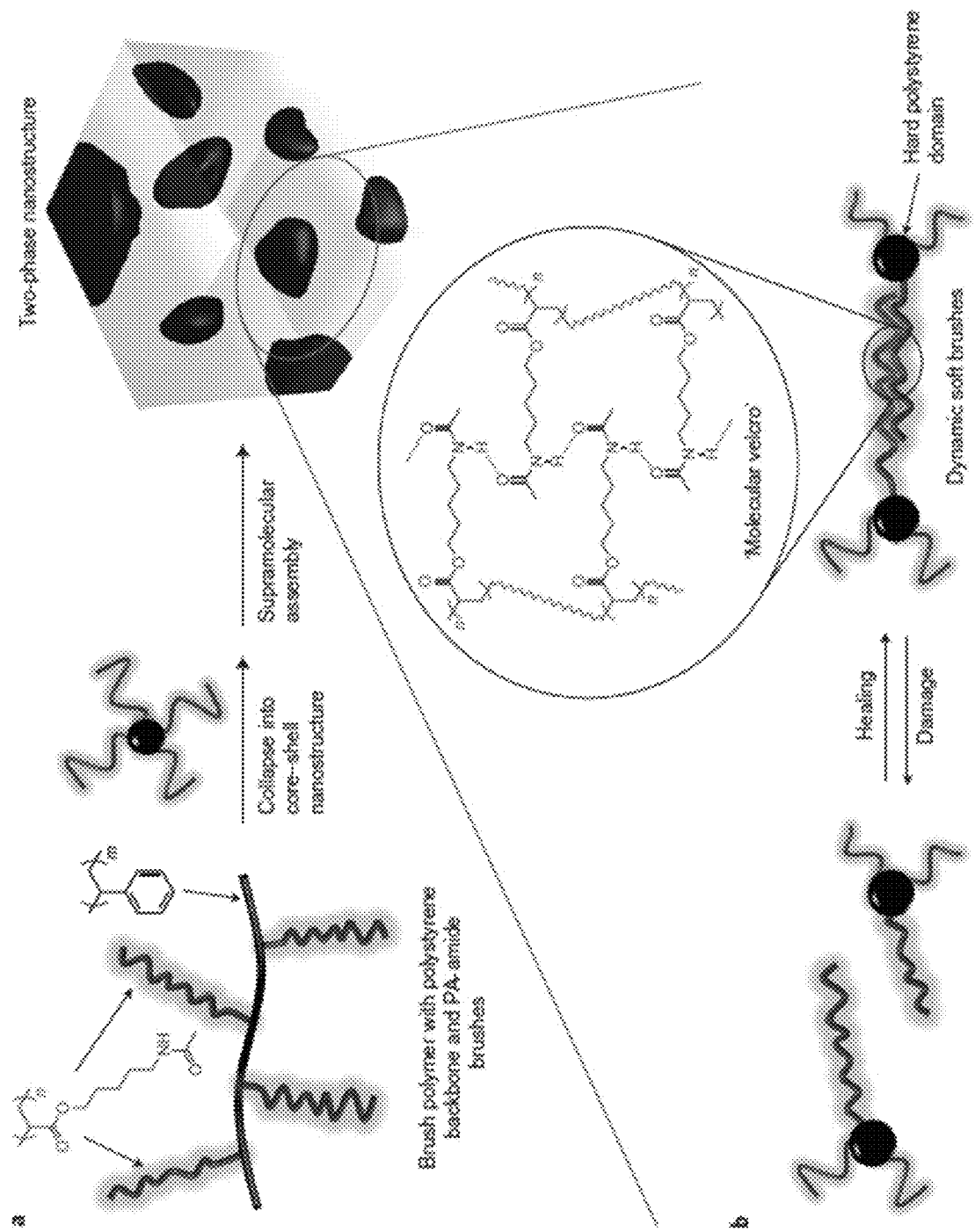
Figure 5C:
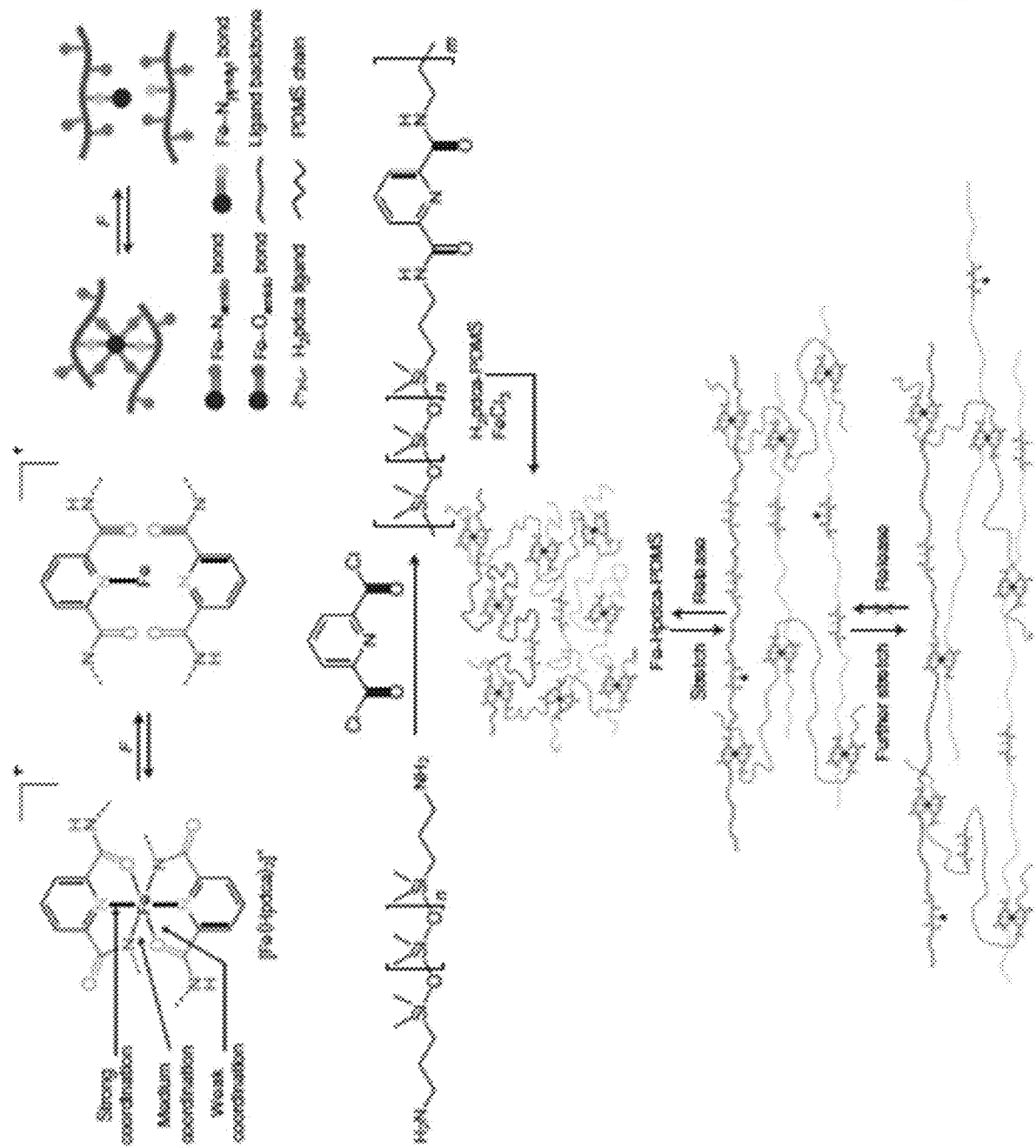

FIGS. 5A-5C illustrate examples of polymer films used to form the electronic circuits and/or connector circuits, in accordance with various embodiments. FIG. 5A illustrates an example of a self-healing and thermoreversible rubber that exhibits a maximum strain of 600 percent and self-healing efficiency of 90 percent or more when healed for three hours at room temperature. FIG. 5B illustrates an example of a self-healing thermoplastic elastomer that exhibits a maximum strain of 700 percent, self-healing efficiency of around 80 percent when healed for twenty-four hours at room temperature, and self-healing efficiency of around 30 percent when healed for fifteen minutes at room temperate. FIG. 5C illustrates a stretchable and self-healing elastomer that exhibits a maximum strain of 1600 percent, self-healing efficiency of around 80 percent when healed for twenty-four hours at room temperature, and self-healing efficiency of around 30 percent when healed for thirty minutes at room temperate. For more general information on example polymer films and specific information on the illustrated polymer films, reference is made to P. Cordier, et al., "Self-healing and Thermalreversible Rubber From Supramolecular Assembly", Nature Letter, 45, 21 (2008), Y. Chen, et al., "Multiphase Design of Autonomic Self-healing Thermoplastic Elastomers", Nature Chemistry, 4, 28 (2012), and C. H. Li, et al. "A Highly Stretchable Autonomous Self-Healing Elastomer", Nature Chemistry, 8, 618 (2016), each of which are fully incorporated herein by reference for their teachings. As previously provided, for more general information on polymers and specific information on example stretchable and healable polymers, reference is made to Ducrot, E., et al., "Toughening elastomers with sacrificial bonds and watching them break," Science 344, 186-189 (2014); Neal, J. A., et al., "Enhancing mechanical performance of a covalent self-healing material by sacrificial noncovalent bonds," J. Am. Chem. Soc., 137, 4846-4850 (2015); Grindy, S. C. et al., "Control of hierarchical polymer mechanics with bioinspired metal-coordination dynamics," Nature Mater, 14, 1210-1216 (2015); and Li, C.-H., et al., "A highly stretchable autonomous self-healing elastomer," Nature Chem., 8, 618-624 (2016), each of which is hereby incorporated by reference in its entirety for their teachings.

As described above, such self-healing and flexible polymer films can be used to form a variety of different types of module electronics. The modular electronics can self-heal together to form an assembly and to be used for a variety of different applications, such as wearable devices, implantable or non-implanted medical device, health monitoring devices, Internet of Things and/or other communication devices, etc.

Experimental/More Detailed Embodiments

Various embodiments are directed to modular electronics formed of a self-healing and flexible/stretchable polymer film. The different electronic circuits and connector circuits can be assembled into different 2D and 3D apparatuses, and can be dissembled and reassembled due to the self-healing ability of the polymer film.

In specific embodiments, the polymer film is a supramolecular stretchable, tough and self-healing polymer film, constructed via a mixture of strong and weak cross-linking dynamic bonds. The resulting polymer possesses a combination of exceptional mechanical properties, e.g., good stretchability, toughness and autonomous self-healing in water and/or other liquids, such as sweat. This unique combination of properties enables fabrication of 2D and 3D structures, capacitive strain sensing e-skin and stretchable modular electronic systems with high toughness, stretchability and robustness against damage. The molecular design is simple and is applicable to various polymer structures.

In various specific experimental embodiments, the PDMS-MPUx-IU1-x polymer films can be formed by dissolving 3-5 grams (g) of PDMS-MPUx-IU1-x in 15 mL-20 mL $CHCl_3$ and stirred at 50° C. Resultant viscous solution are stirred for more than three hours and ware subsequently gradually cooled down to room temperature. The resultant solution is poured onto OTS-treated silicon substrates (e.g., four inches) and dried at room temperature for six hours followed by drying at 80° C. under reduced pressure (about 100 torr) for three hours. Polymer films are then peeled off after cutting in certain dimensions and ready for mechanical testing.

The resulting polymer films can be tested to identify various properties of the films. Mechanical tensile-stress experiments can be performed using an Instron 5565 instrument. At least three samples are tested for each type of polymer film. Tensile experiments are performed at ambient conditions with samples with width of five mm, thickness of around 0.5 mm, length of ten mm and controlled strain-rate of twenty mm/mm. For determination of fracture energy, the procedures of pure-shear test is described by Ducrot, E. et al., "Toughening elastomers with sacrificial bonds and watching them break," Science 344, 186-189 (2014) and Sun, J. Y. et al., "Highly stretchable and tough hydrogels," Nature 489, 133-136 (2012), which are both incorporated herein in their entirety for their teachings. A sample with a length of five mm, a thickness of 0.5 mm, and a width of forty mm can be used. For a notched sample, a notch of twenty mm length is made in the middle of a strip of film with a strain-rate of fifty mm/mm. For self-healing tests, the polymer films are cut into two pieces and then the cut surfaces are put in contact. The polymer films are then healed at room temperatures for different periods. The healed polymer films are then stretched. The healing efficiency can be defined as the ratio of strain at break between healed film and original film. Values of the Young's modules, maximum strain at break, and healing efficiencies are determined according to data of at least three trials.

For various experimental and more detail embodiments, Bis(3-aminopropyl) terminated poly(dimethylsiloxane) ($H_2N$-PDMS-$NH_2$, Mn=5000-7000) is purchased from Gelest. The remaining chemicals and solvents are purchased from Sigma-Aldrich. All chemicals used as received without further purification. NMR ($^1H$ and $^{13}C$) spectra can be recorded on a Varian Mercury 400 NMR spectrometer in deuterated solvents at room temperature. Infrared spectra were recorded with a Horiba Jobin-Yvon Fluorolog-3 fluorometer. Absorption spectra were recorded on an Agilent Cary 6000i UV/Vis/NIR Spectrophotometer. Analytical gel permeation chromatography (GPC) experiments can be performed on a Malvern VE2001 GPC solvent/sample Module with three ViscoGEL™ IMBHMW-3078 columns. The calibration can be based on polystyrene standards with narrow molecular weight distribution. Differential Scanning calorimetry (DSC) experiments are performed using a Model Q2000 from TA Instruments. The temperature range can be −90 to 150° C., at a heating and cooling speed of 10° C./min. Dynamic mechanical analysis measurement is carried out on dynamic mechanical Analyzer TA Instrument Q800 (strain rate of 0.01 mm/mm; frequency sweeps at 0.1-10 Hz; Temperature: −90-10° C.). Viscosity measurements can be carried out on an Ares G2 rheometer with an Advanced Peltier System (APS) as the bottom plate and a 40 mm cone as the top geometry. The shear rate sweep is performed from 1 l/s to 1000 l/s. All solutions are Newtonian. The chips for modular electronics are ordered from Mouser electronics.

In specific experimental embodiments, the PDMS-MPU$_{0.4}$-IU$_{0.6}$ polymer can be synthesized by adding Et$_3$N (10 mL) to a solution of H$_2$N-PDMS-NH$_2$ (100 g, Mn=5000-7000, 1 eq) in anhydrous CHCl$_3$ (400 mL) at 0° C. under argon atmosphere. After stirring for 1 hour, a mixture solution (CHCl$_3$) of 4,4'-Methylenebis(phenyl isocyanate) (2.0 g, 0.4 eq) and Isophorone diisocyanate (2.7 g, 0.6 eq.) is added dropwise. The resulting mixture is stirred for 1 hour while the temperature is kept at 0° C. with ice water. The solution is then allowed to warm to room temperature and stirred for 4 days. After reaction, MeOH (15 mL) is added for complete removal of remained isocyanate and stirred for 30 minutes. Then, solution is concentrated to ½ of its volume and 60 mL MeOH is poured into it to precipitate. White precipitate-like viscous liquid appeared and the mixture is settled for 30 minutes. The upper clear solution is then decanted. 100 mL CHCl$_3$ is added to dissolve the product. The dissolution-precipitation-decantation process is repeated for three times and the final product is subjected to vacuum evaporation to remove the solvent and trace of Et$_3$N. A yield of 65 g (63 percent) is obtained with a molecular weight according to GPC of: Mw=103,400; Mn=65,000 (Đ=1.6) $^1$H NMR (400 MHz, d5-THF): δ 7.33 (d, J=8.0 Hz, 4H), 6.97 (d, J=8.0 Hz, 4H), 3.77 (s, 2H), 0.01 (b, 1325H). $^{13}$C NMR (400 MHz, CDCl$_3$): δ 158.78, 139.18, 137.31, 125.34.

For example, PDMS-MPU, PDMS-IU, PDMS-MPU$_{0.2}$-IU$_{0.8}$, PDMS-MPU$_{0.3}$-IU$_{0.7}$, and PDMS-MPU$_{0.5}$-IU$_{0.5}$ are synthesized using different mixing molar ratio of 4,4'-Methylenebis(phenylisocyanate) and Isophorone diisocyanate according to the same procedure as that used for PDMS-MPU$_{0.4}$-IU$_{0.6}$. For PDMS-MPUx-IU1-x, mixture of 4,4'-Methylenebis(phenyl isocyanate) (x eq) and Isophorone diisocyanate (1-x eq.) is used.

For PDMS-MPU, in various experimental embodiments, resulting molecular weight according to GPC includes: Mw=99,000; Mn=71,000 (Đ=1.4) $^1$H NMR (400 MHz, d5-THF): δ 7.33 (d, J=8.0 Hz, 4H), 6.97 (d, J=8.0 Hz, 4H), 3.77 (s, 2H), 0.01 (b, 520H). For PDMS-IU resulting molecular weight according to GPC includes: Mw=123,000; Mn=68,000 (Đ=1.8)$^1$H NMR (400 MHz, CDCl$_3$): δ 7.15 (b, 2H), 6.91 (b, J=8.0 Hz, 2H), 3.48 (d, J=9 Hz, 4H), 1.71 (m, 4H), 0.63 (d, J=9 Hz, 4H), 0.01 (b, 545H). For PDMS-MPU0.2-IU0.8 resulting molecular weight according to GPC includes: Mw=112,000; Mn=84,000 (Đ=1.3) $^1$H NMR (400 MHz, d5-THF): δ 7.33 (d, J=8.0 Hz, 4H), 6.97 (d, J=8.0 Hz, 4H), 3.77 (s, 2H), 0.01 (b, 2531H) For PDMS-MPU0.3-IU0.7 resulting molecular weight according to GPC includes: Mw=116,000; Mn=73,000 (Đ=1.6) $^1$H NMR (400 MHz, d5-THF): δ 7.33 (d, J=8.0 Hz, 4H), 6.97 (d, J=8.0 Hz, 4H), 3.77 (s, 2H), 0.01 (b, 1633H). For PDMS-MPU0.5-IU0.5 resulting molecular weight according to GPC include: Mw=99,000; Mn=69,000 (Đ=1.4) $^1$H NMR (400 MHz, d5-THF): δ 7.33 (d, J=8.0 Hz, 4H), 6.97 (d, J=8.0 Hz, 4H), 3.77 (s, 2H), 0.01 (b, 1011H).

In various experimental embodiments, the electronic circuits are fabricated by inkjet printing (100 percent black solid ink with a XEROX ColorQube 8570DN) on double-sided copper-clad laminate and an all-polyimide composite of polyimide film bonded to the copper foil (Dupont Pyralux AP 7163E). AP 7163E has dielectric (polyimide) thickness equal to 25.4 um and copper thickness (each side) equal to 9 um. The corresponding circuit designs can be developed with CadSoft Eagle (educational) and exported in vector format. Initially, the circuit files can be printed on 8.5×11 inches letter-size paper and then an accordingly sized piece of Pyralux are aligned and attached on top of the printed circuit area with Kapton tape (25.4 um thickness and 12.7 mm width). The printing process is then repeated and the circuit is printed on the copper coated surface. After 10 min of drying in ambient conditions the printed Pyralux in cut into pieces according to the circuit size and each one of them is etched in 50° C. bath on Ferric Chloride (tds-415 MG Chemicals). The bottom side is etched for 5 min to remove the copper coating and then the top side was also submerged for an average of 4 min depending on the density of the printed features. Once the circuit is developed, the etched Pyralux is removed from the ferric chloride bath and washed thoroughly in ambient temperature de-ionized water. Once dried, the Pyralux is submerged in toluene bath and manual swabbing is applied to remove the ink and reveal the circuit's copper traces. The circuits are washed again and dried with a nitrogen gun. At the final step the surface of the circuit is treated with liquid tin according to material's datasheet (421 MG Chemicals).

Figure 6A:
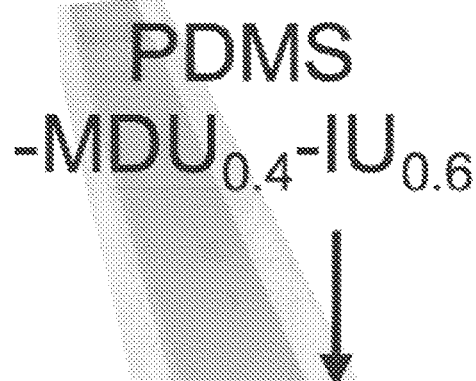
FIGS. 6A-6G illustrate example properties of polymer films formed using the elastomer material, in accordance with various embodiments.
Figure 6B:
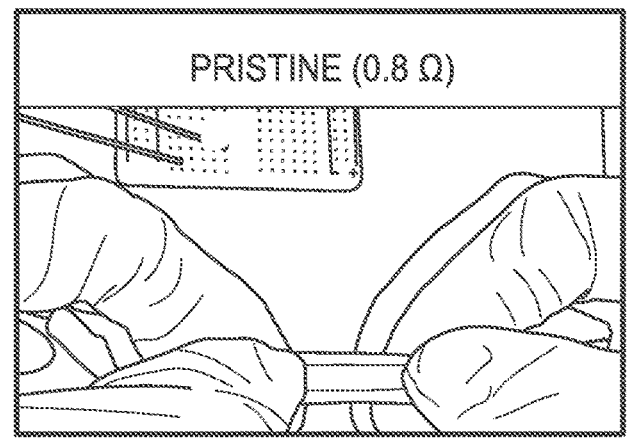
Figure 6C:
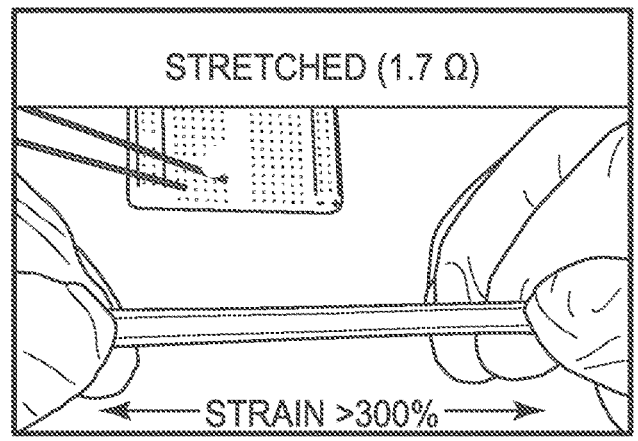

FIGS. 6A-6G illustrate an example of a self-healable electrode formed using the elastomer material. For example, FIG. 6A is a schematic illustration of self-healing electrode. FIG. 6B illustrates an optical image of self-healing electrode equipped with LED lamp before stretching and FIG. 6C illustrates an optical image of the self-healing electrode after stretching.

Taking advantage of these features, various experiment embodiments include the fabrication of stretchable and autonomous self-healing electrodes with liquid metal EGaIn as a conductive layer and PDMS-MPU$_{0.4}$-IU$_{0.6}$ as the encapsulation and supporting layer EGaIn can be used for fabricating stretchable and self-healing electrodes. Encapsulation of EGaIn in PDMS as a layer form is challenging due to poor wetting of the polar EGaIn liquid on the highly hydrophobic PDMS surface. In contrast, EGaIn exhibit good wetting properties on PDMS-MPU$_{0.4}$-IU$_{0.6}$ films, which is believed to be due to the interactions between urea groups and native oxide layer (e.g., FIGS. 6D-6E). This electrode exhibits high stretchability (e.g., 500 percent) with stable (e.g., 100 cycles) and low resistance. Importantly, this electrode is self-healable, i.e. can be repeatedly connected after cutting, at room-temperature.

The self-healing electrode can be fabricated by taking advantage of the moldable feature of the polymer at high temperature and its bonding property. A wafer-sized polymer film with 0.8 mm thickness on OTS-treated silicon substrate is prepared. The polymer film on substrate is pressed by Teflon mold at 80° C. and allowed to rest for two hours. Then, after removing the Teflon mold, successful patterns with periodic polymer walls are confirmed and liquid metal alloy (EGaIn) is bladed onto the pattern by using small piece of polymer film and other polymer film with 0.3 mm thickness is subsequently put on patterned film with liquid metal as an encapsulation layer. The bonding process involves annealing at room temperature for six hours after applying gentle pressure to keep the two pieces in good contact; robust self-healing electrode can be obtained with a stable interface. Gentle pressure, as used herein, can include or refer to around 1 kilopascal (kPa) of pressure and/or a pressure sufficient to make physical contact between two polymer films. The electronic skin is fabricated by sandwiching a dielectric layer with two self-healing electrodes, in which the thickness of the dielectric layer is 330 μm.

In a number of experimental embodiments, the electrode is cut. When the electrode is cut into two pieces and put together for self-healing, the electrical conductivity can recover instantaneously when two broken pieces are put in contact. After nine hours of healing at ambient condition, the electrical and mechanical properties of the self-healed electrode are almost identical to the original one. Furthermore, the electrode can be molded into 3D structures owing to its thermoplastic property. Accordingly, various embodiments are directed to an ambient self-healing electrode formed of an elastomer in accordance with the various embodiments. The ambient self-healing electrode exhibits a stretchability of at least 500 percent and can be up to 1,200 percent and low resistance of around 3 ohm, although the electrical resistance can depend on the dimension of the conductive line(s) and can be observed to be a stable and reversible resistance of up to 500 percent (e.g., see, FIG. 6D).

Figure 6D:
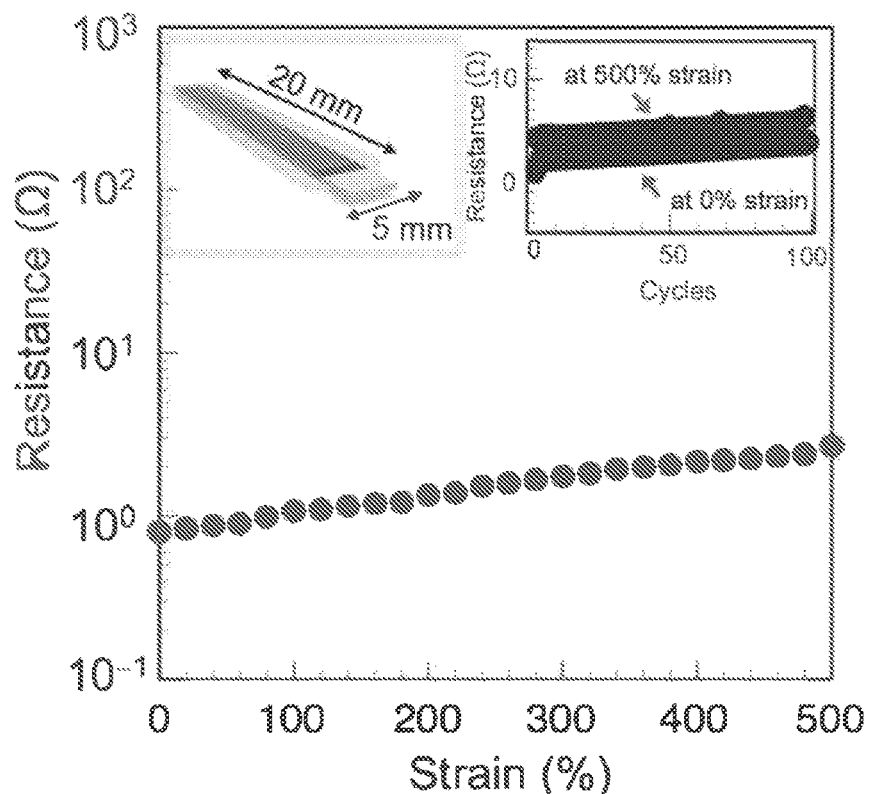

FIG. 6D illustrates an example of electrical resistance as a function of strain with self-healing electrode and electrical resistance under cyclic stretching, in accordance with various embodiments.

Figure 6E:
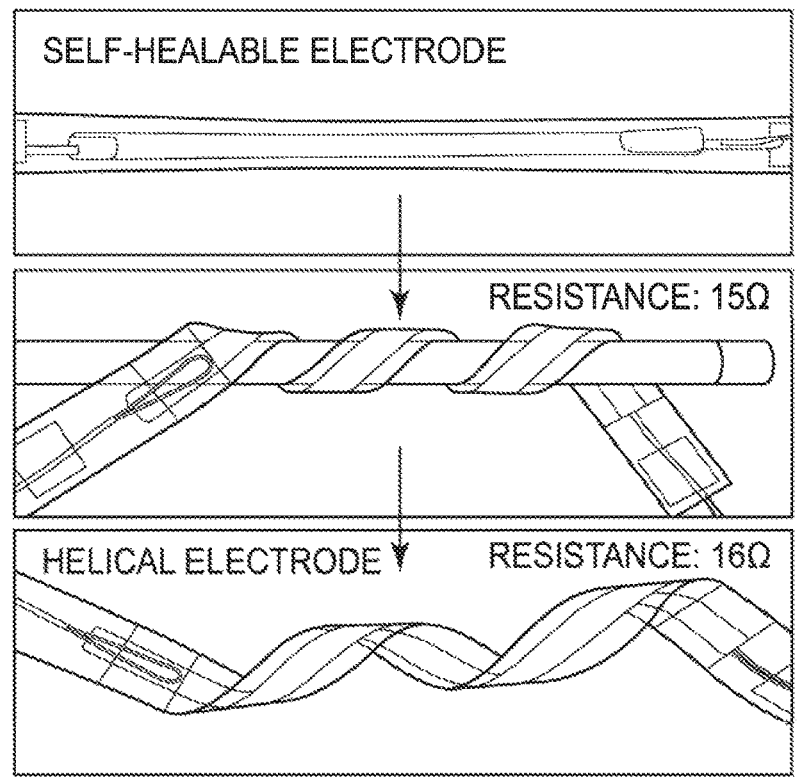

FIG. 6E illustrates an example of molding a self-healable electrode, in accordance with various embodiments. For example, the optical images show the possibility to change shape of the self-healing electrode by taking advantage of its thermoplastic property. The self-healing electrode has a flat linear shape (top). It is wrapped around a rod (middle) and is held at this configuration at 50° C. for 30 minutes. After removal of the rod, the electrode maintains the helical shape without the template (bottom).

In other experimental and more detailed embodiments, a fully self-healing e-skin (capacitive strain sensor) is demonstrated which exhibits high resistance to constant mechanical damage and complete room temperature self-healability even after complete cutting.

Figure 6F:
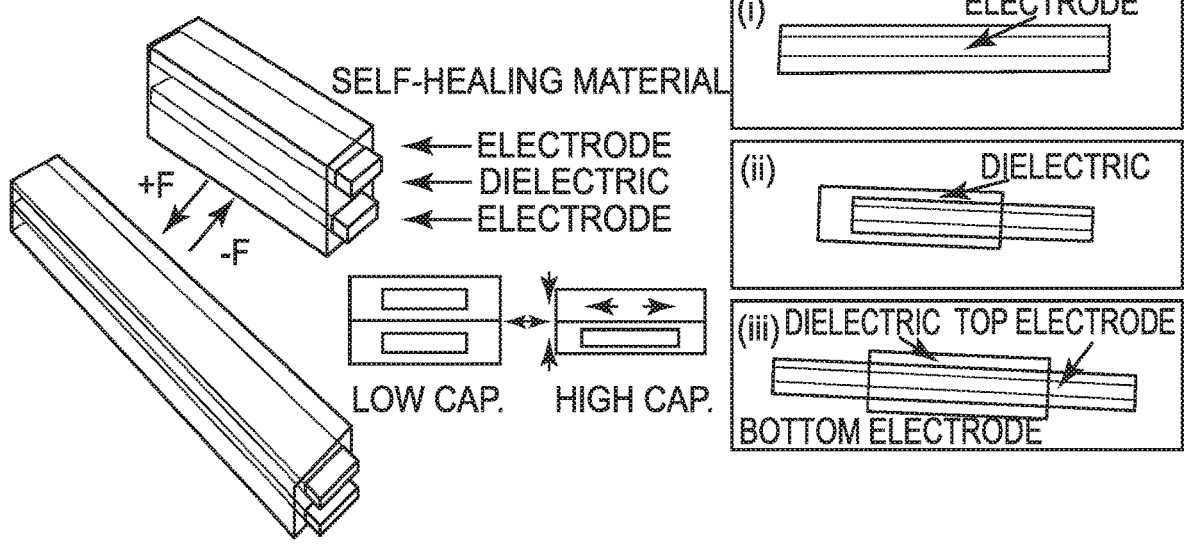

FIG. 6F illustrates an example of a self-healable capacitive strain sensor formed using the elastomer material. In various specific embodiments, a strain sensor is fabricated by bonding two self-healing electrodes, as described above. For example, as illustrated by the right side of FIG. 6F, a self-healable capacitive strain sensor can be formed by preparing two electrodes, attaching a dielectric layer to one of the electrodes, and attaching the other electrode as a counter electrode resulting the sandwich structure illustrated by the left side of FIG. 5F. In specific embodiments, the strain sensor is fabricated based on bonding between layers through the stack and annealing at room temperature for at least six hours.

Figure 6G:
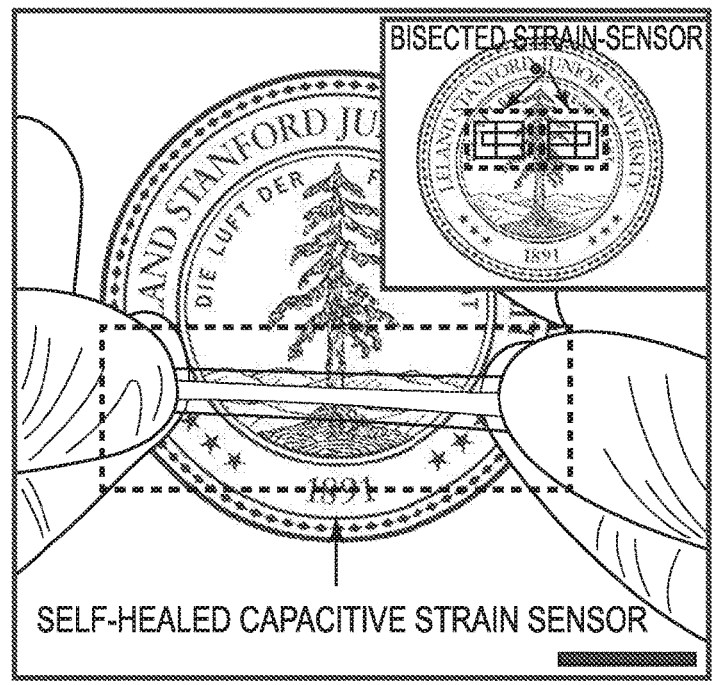

FIG. 6G illustrates an example a self-healing of the capacitive strain sensor illustrated by FIG. 6F. More specifically, FIG. 6G includes optical images of the cut strain sensor (inset) and that the healed strain-sensor maintains high stretchability, such as up to 500 percent for sensing that is reversible and stable. By increasing the healing time, the healed strain-sensor can stably operate at up to 400 percent strain. FIG. 6G also illustrates that the polymer film is transparent.

Figure 7:
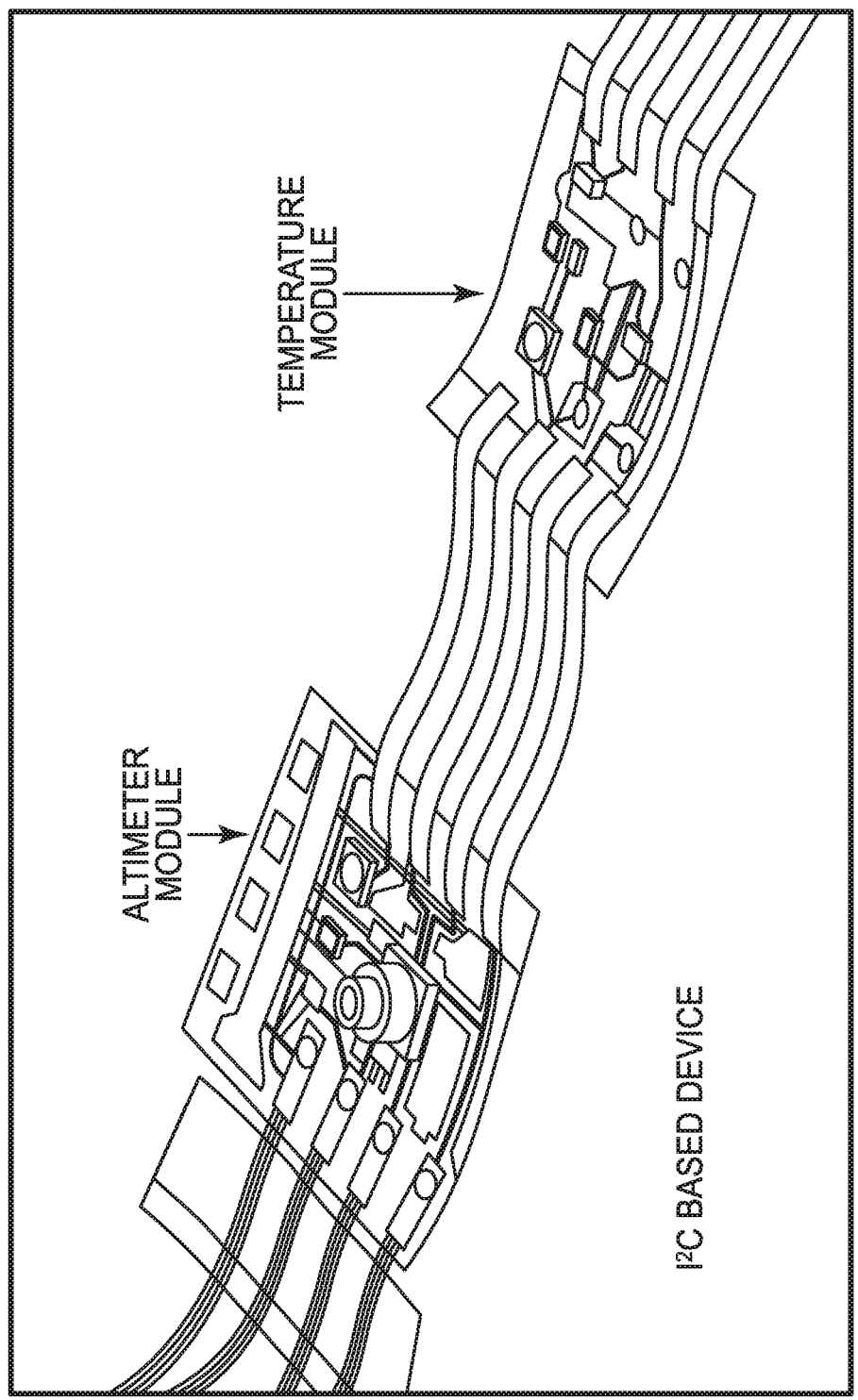
FIG. 7 illustrates an example of an experimental assembly include two electronic circuits, an altimeter and a temperature sensor, connected via a connector, in accordance with various embodiments.

FIG. 7 illustrates an example of an experimental assembly including two electronic circuits, i.e., an altimeter and a temperature sensor, connected via a connector circuit, in accordance with various embodiments. In specific embodiments, the illustrated assembly is an I²C based dual functional device, where an altimeter sensor module and a temperature sensor module are interconnected through the room-temperature bonding process.

FIGS. 8A-8B illustrate optical images of a wearable device (FIG. 8A) and stretched device (FIG. 8B), in accordance with various embodiments. The device illustrated by FIGS. 8A-8B can include the I²C communication device that has dual functionalities, similar to the device illustrated FIG. 7.

Figures 8C, 8D:
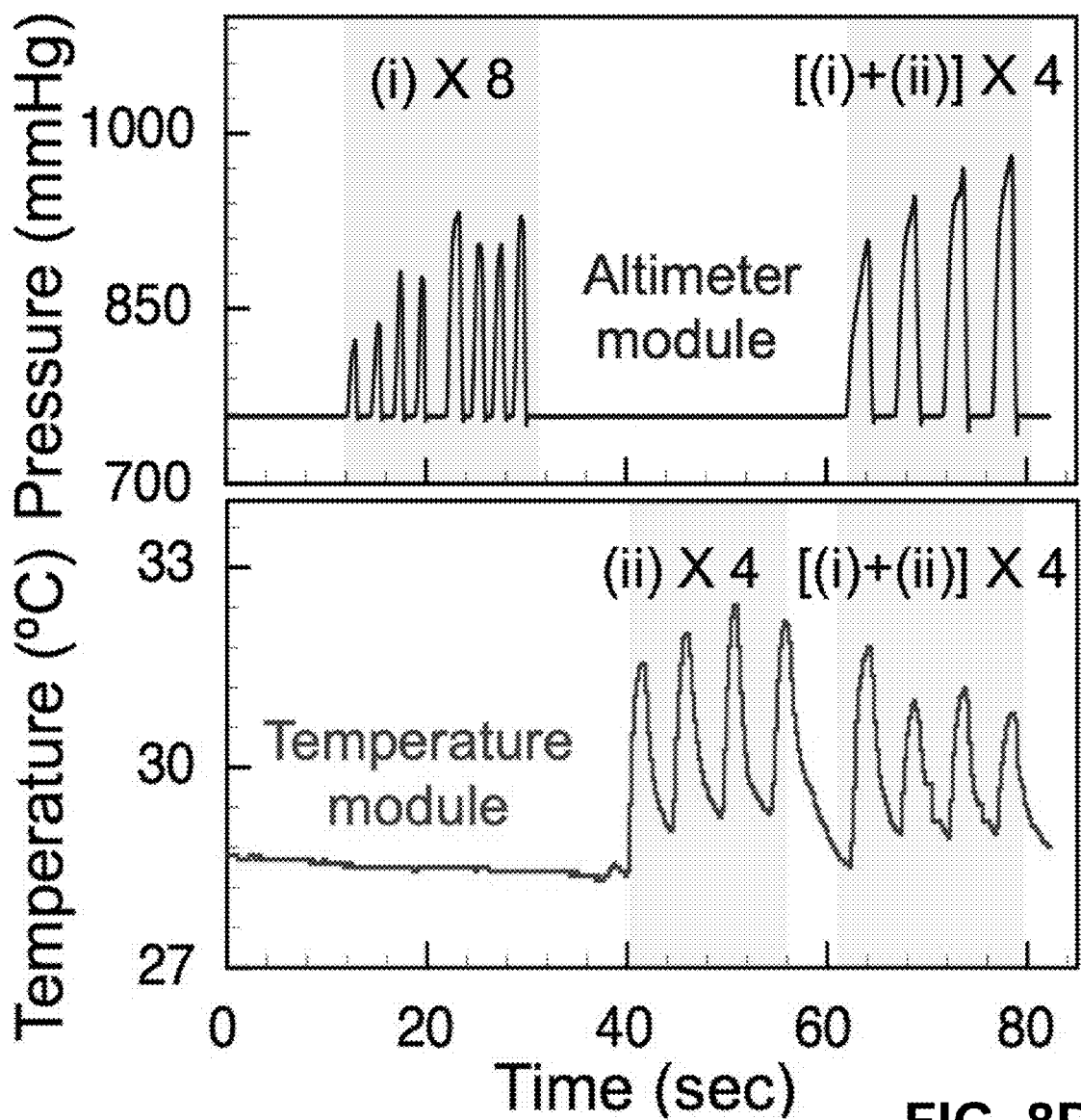
FIGS. 8C-8D illustrate example simultaneous measurement of atmospheric pressure change and temperature change by altimeter module and temperature sensor, in accordance with various embodiments.

FIGS. 8C-8D illustrate example simultaneous measurement of atmospheric pressure change (FIG. 8C) and temperature change (FIG. 8D) by altimeter module and temperature sensor, respectively, such as from a device as illustrated by FIGS. 7 and 8A-8B, in accordance with various embodiments. The sensor modules are monitored continuously over a period of 80 seconds while the sensor input is varied initially separately for each sensor and then simultaneously for both sensors. The atmospheric pressure can be increased by squeezing a specially adapted bulb duster against the tip of the MS5805 altimeter. The temperature increase can correspond to gentle exhaling of a human on the surface of the TMP102 temperature sensor. The altimeter module, temperature module and microcontroller communicate with one another based on I²C digital communication method.

Figure 9:
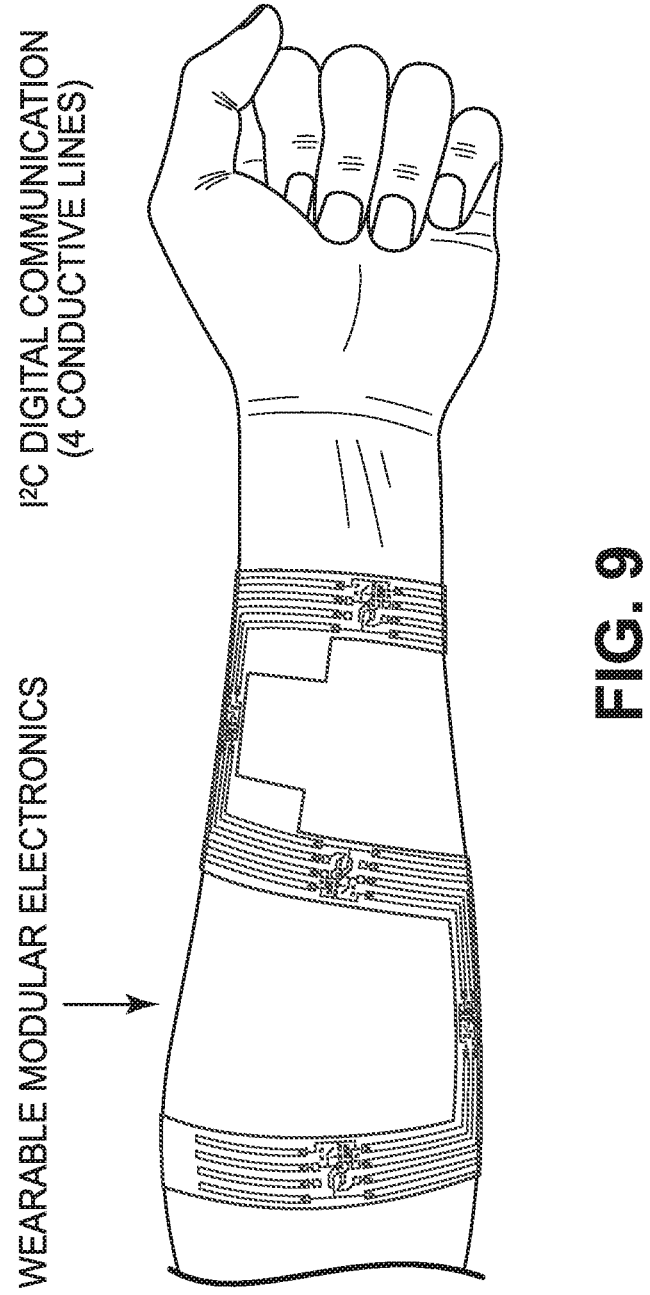
FIG. 9 illustrates an optical image of a stretchable modular wearable electronic device composed of five modules and four connectors on a human arm, in accordance with various embodiments.

FIG. 9 illustrates an optical image of a stretchable modular wearable electronic device composed of five modules and four connectors on a human arm, in accordance with various embodiments. The example assembly process can include 3 hours bonding at room temperature. Average resistance of conductive lines can be estimated as 5 ohm after assembly.

Figure 10:
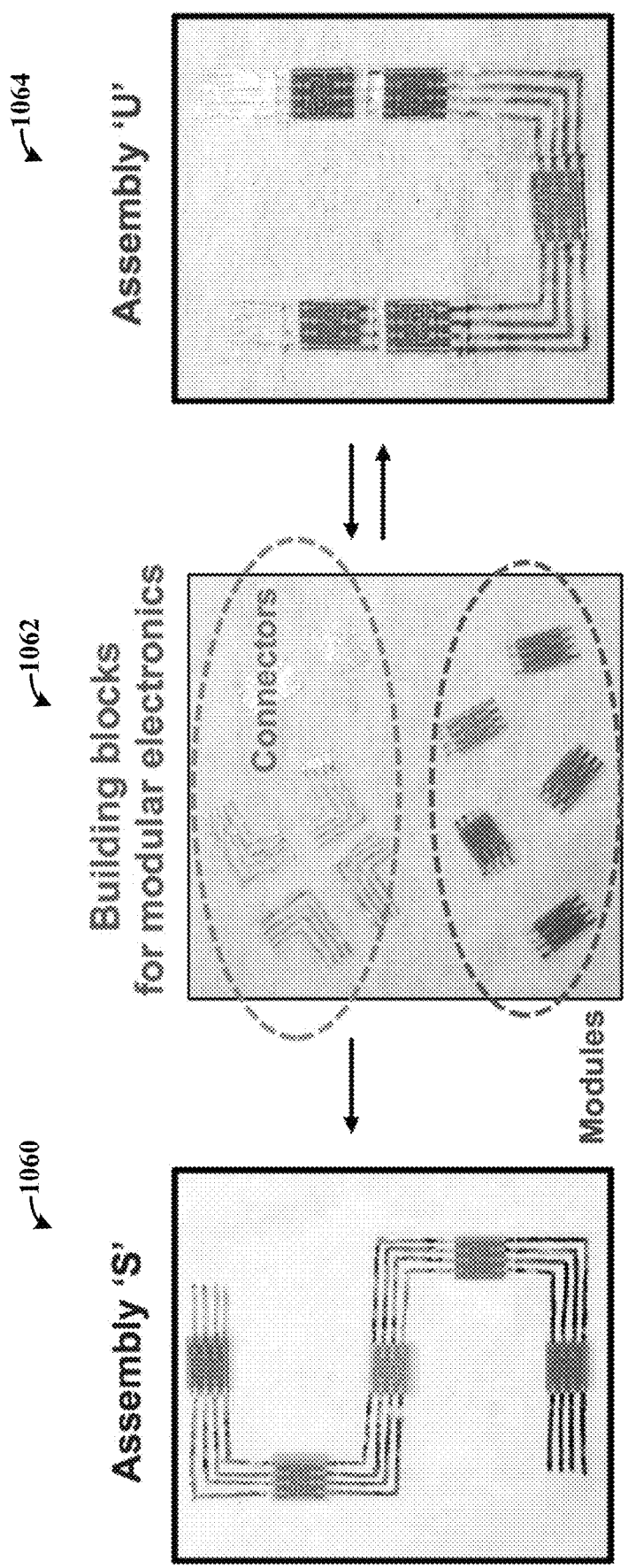
FIG. 10 illustrates an example of using the same electronic circuits and connector circuits to form different shaped assemblies, in accordance with various embodiments.

FIG. 10 illustrates an example of using the same electronic circuits and connector circuits (e.g., the middle) to form different shaped assemblies, in accordance with various embodiments. As illustrates on the left side of FIG. 10, one assembly can include an S-shape assembly 1060 and as illustrated on the right side, another assembly can include a U-shape assembly 1064, which are both formed using the electronic circuits and connector circuits 1062. The different assemblies can be sequentially formed by repeated processes of assembly and disassembly. For example, the S-shaped can be assembled by placing the corresponding electronic circuits in contact with the respective connector circuits and allowing them to bond at room temperature. The S-shape is disassembled by cutting apart the electronic modules and placing the corresponding electronic circuits in contact with the respective connector circuits in the respective U-shape and allowing them to bond at room temperature.

FIGS. 11A-11B illustrate optical images of different 3D assembled modular electronic device using 3D connector circuits and optionally using additional modular components (e.g., other 3D shapes), in accordance with various embodiments.

Figure 12A:
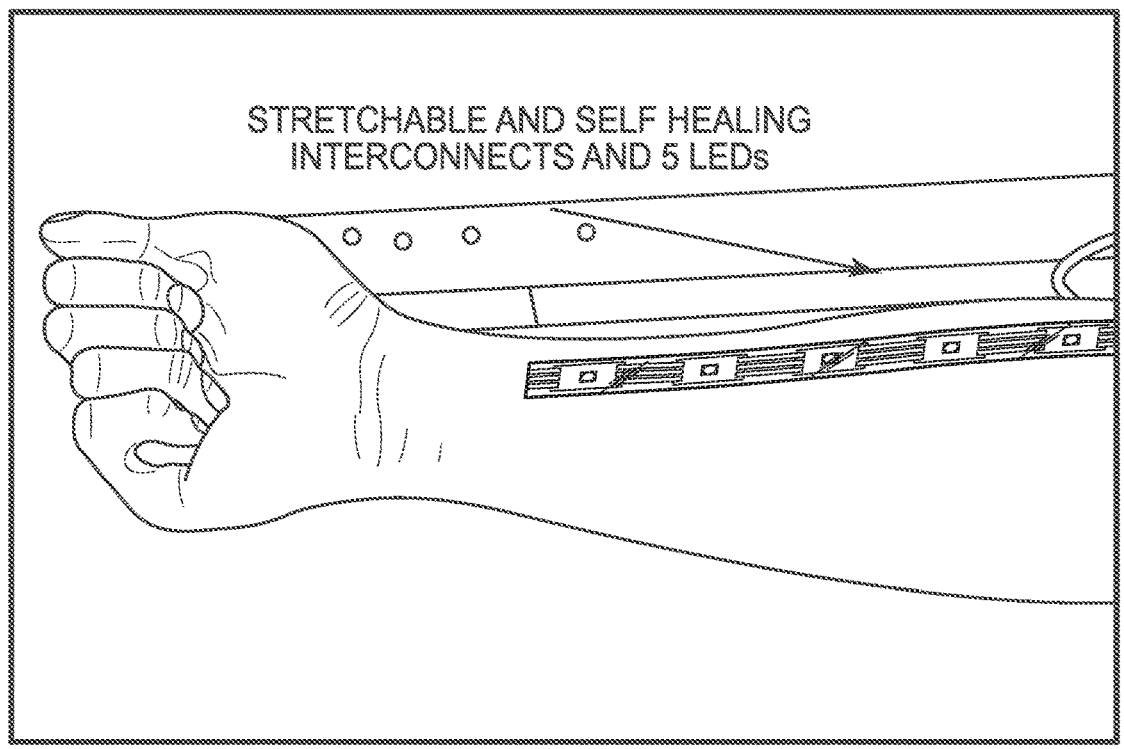
FIGS. 12A-12B illustrate an example of an assembly formed of a plurality of light emitting diode (LED) modules in a linear line, in accordance with various embodiments.
Figure 12B:
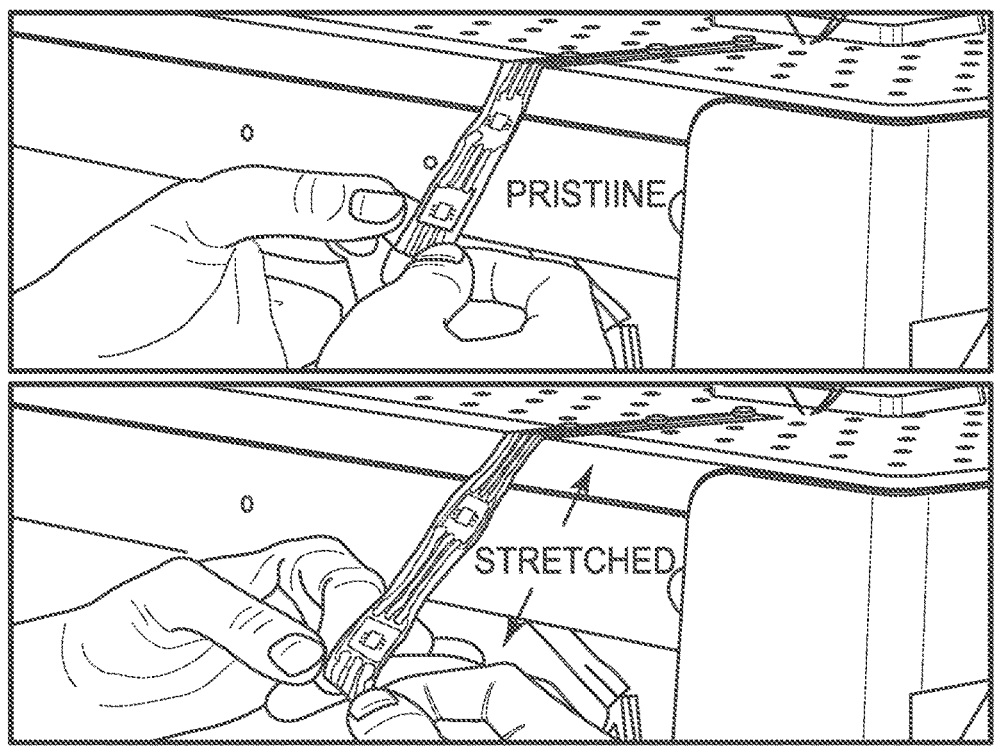

FIGS. 12A-12B illustrate an example of an assembly formed of a plurality of LED modules in a linear line, in accordance with various embodiments. FIG. 12A is an optical image of LED assembly mounted on human arm and FIG. 12B illustrates an example stretching test of the LED assembly.

Figure 13:
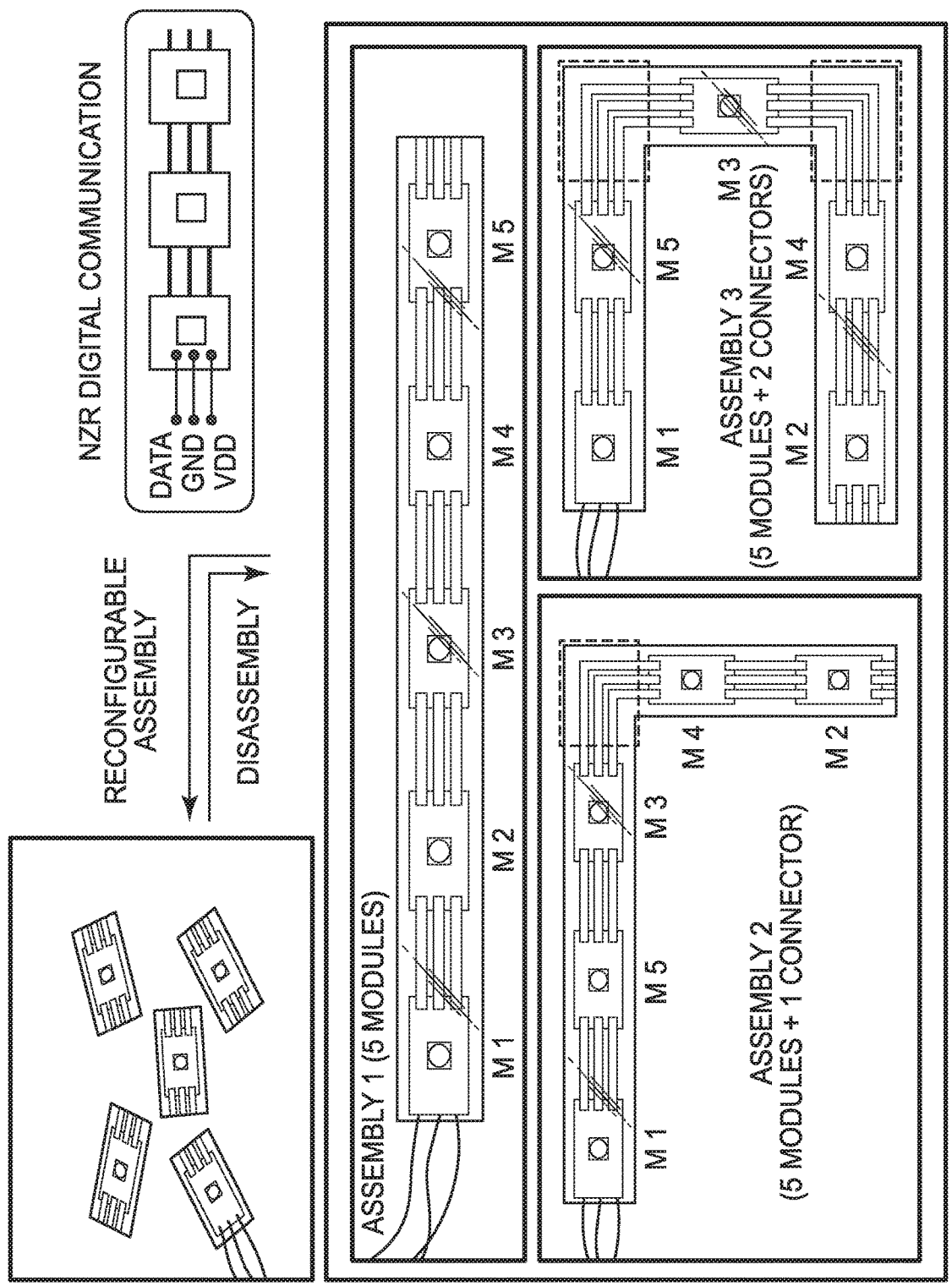
FIG. 13 illustrates optical images showing that individual LED modules, as illustrated by the assembly of FIGS. 12A-12B, in accordance with various embodiments.

FIG. 13 illustrates optical images showing that individual LED modules, as illustrated by the LED assembly of FIGS. 12A-12B, can be configured and reconfigured into a variety of structures and shapes. Five LED modules and microcontroller communicated with one another based on NZR digital communication method.

Figure 14A:
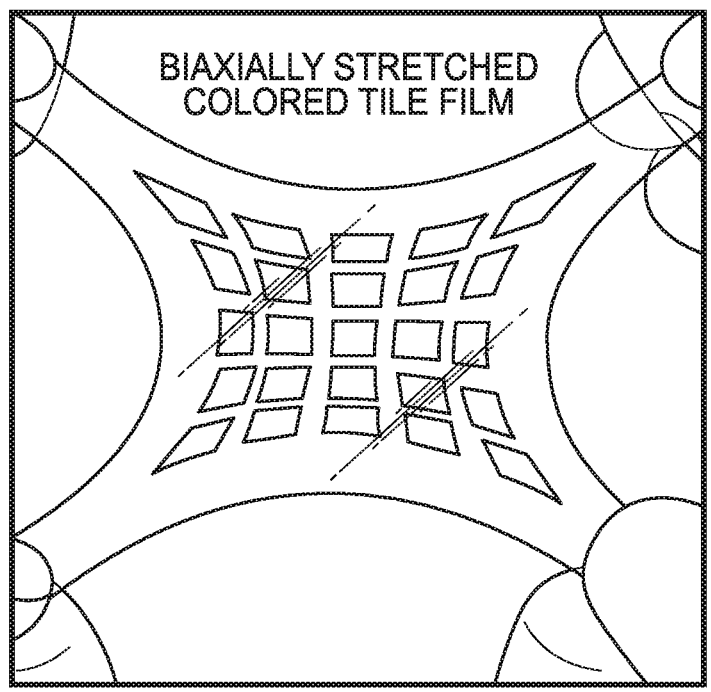
FIGS. 14A-14B illustrate different objects that can be created, in accordance with various embodiments.
Figure 14B:
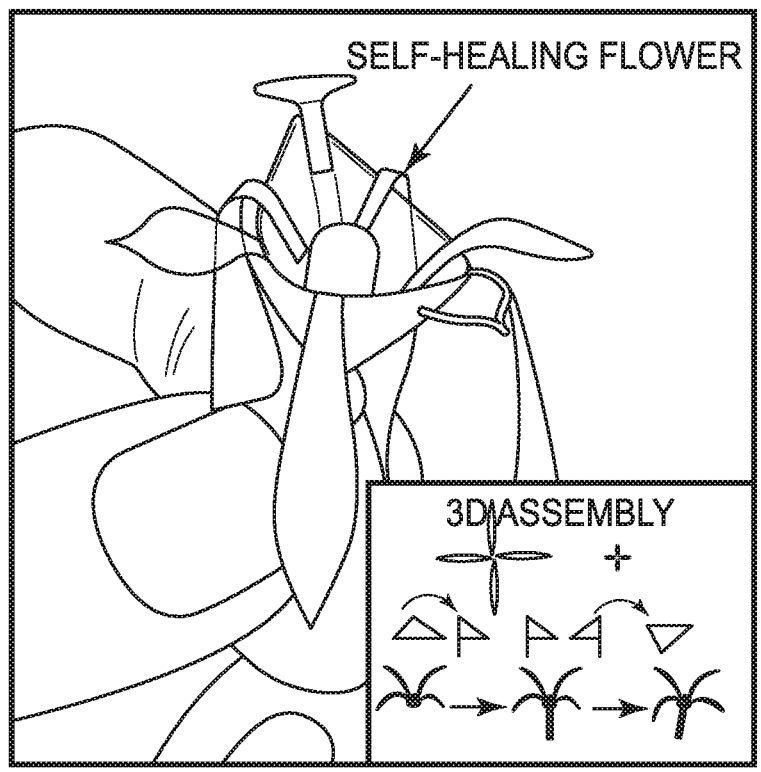

FIGS. 14A and 14B illustrate different 2D and 3D objects that can be created in accordance with various embodiments. FIG. 14A illustrates an example of a film formed of different colored tiles. $PDMS-MPU_{0.4}-IU_{0.6}$ blocks can be readily attached to $PDMS-MPU_{0.4}-IU_{0.6}$ substrate with a robust interface even under (large) applied biaxial strain. To generate a self-healing thermoplastic elastomer for a self-healable electronic skin, in accordance with an experimental embodiment, twenty-five pieces of film blocks are prepared with five different colors. The blocks are attached to a PDMS-MPU$_{0.4}$-IU$_{0.6}$ film substrate and allowed for bonding at room temperature for 6 hours with a gently applied pressure. The resulting patterned film is biaxially stretched without any delamination.

FIG. 14B illustrates an example of a 3D structure formed using the elastomer material. More specifically, FIG. 14B is an optical image of a flower made by bonding various pieces at 50° C. with a green LED (left) and schematic illustration of 3D assembly for flower (inset). The leaves were stained by alkylated-DPP dye.

Figure 15A:
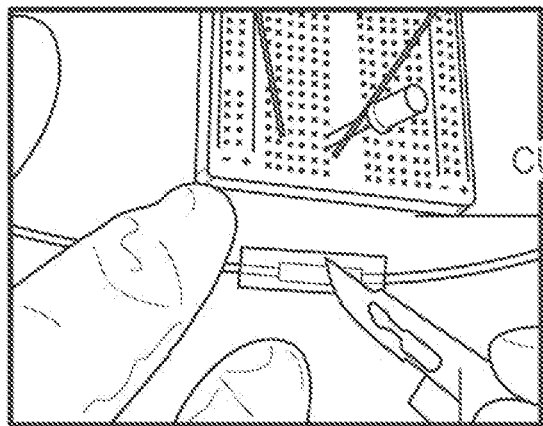
FIGS. 15A-15D illustrate an example experiment of connecting a self-healing electrode to an LED lamp, in accordance with various embodiments.
Figure 15B:
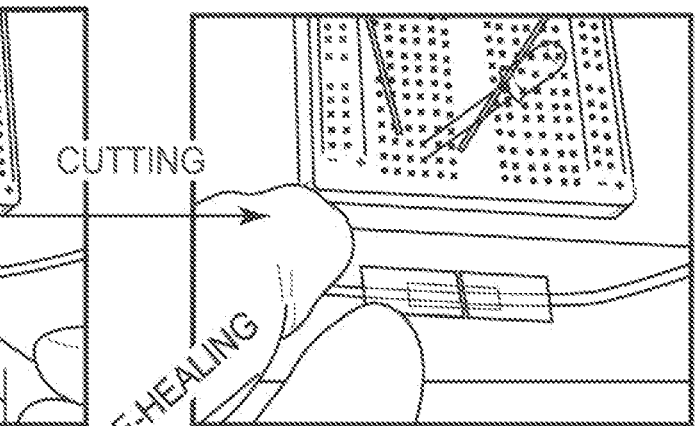
Figure 15C:
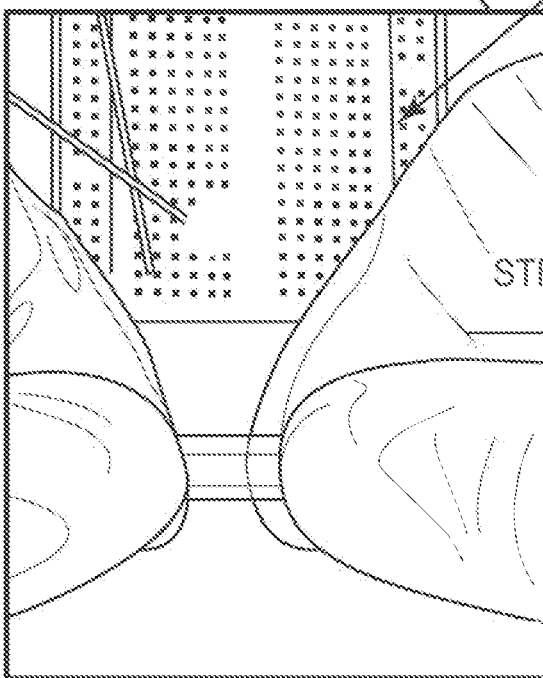
Figure 15D:
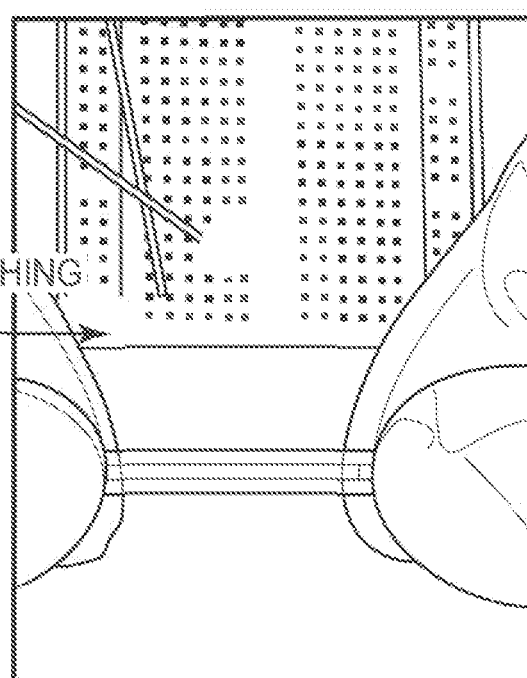

FIGS. 15A-15D illustrate an example experiment of connecting a self-healing electrode to an LED lamp, in accordance with various embodiments. As illustrated by FIGS. 15A and 15B, the electrode is cut, which results in the LED lamp turning off. After being put together and a nine hour self-healing process at room temperature, the electrode is stretched and the LED is on, as illustrated by FIGS. 15C and 15D. Accordingly, the electrode is capable of room-temperature mechanical and electrical self-healing.

Figure 16A:
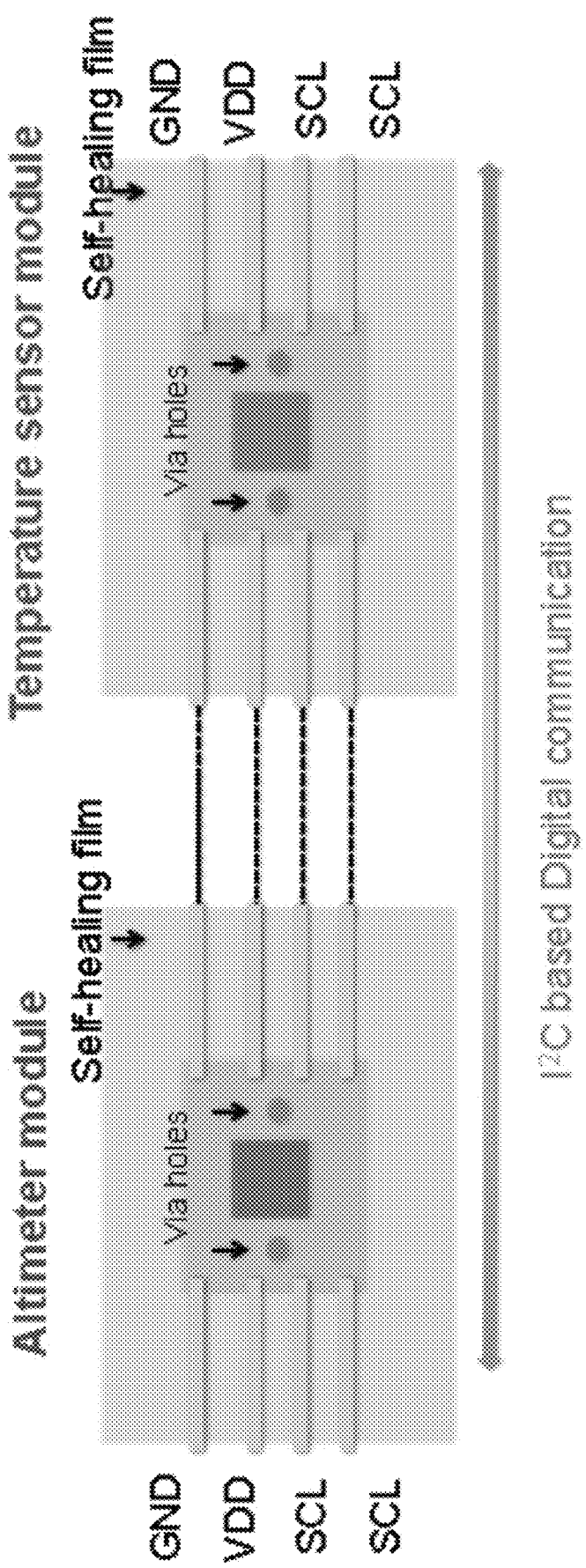
FIGS. 16A-16C are a schematic illustration of an altimeter module and temperature sensor module connected via a connector to form an assembly, in accordance with various embodiments.
Figure 16C:
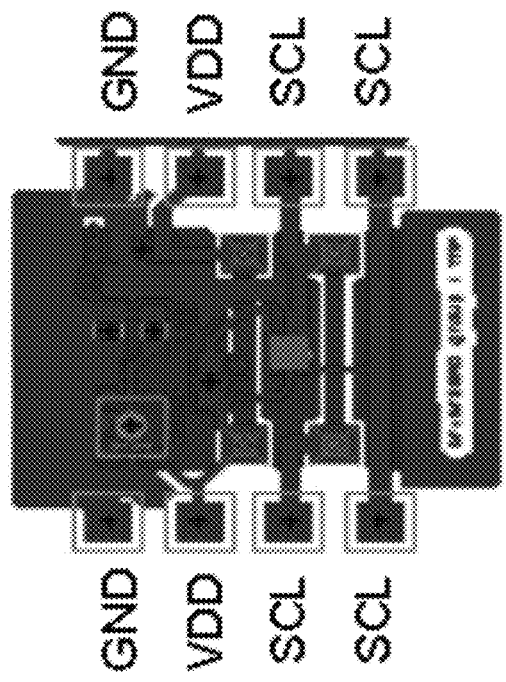
Figure 16B:
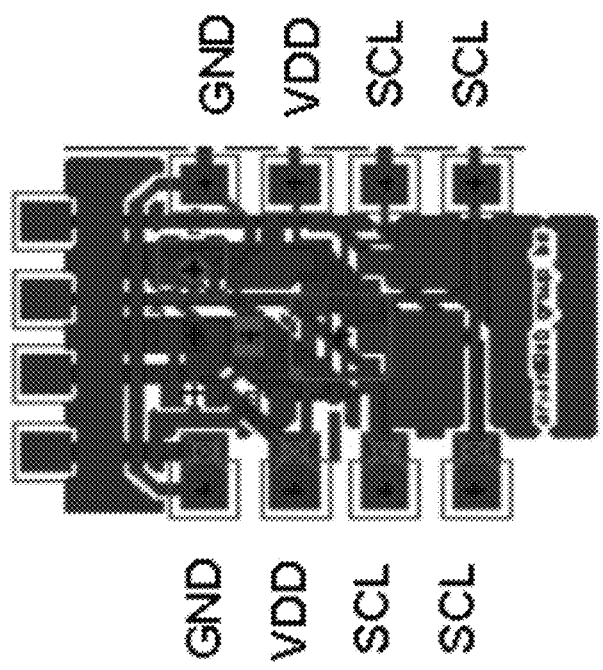

FIGS. 16A-16C are a schematic illustration of an altimeter module and temperature sensor module connected via a connector circuit to form an assembly, in accordance with various embodiments. The connector circuit is formed by four conductive lines, although embodiments are not so limited and can include more or less conductive lines than illustrated. FIG. 16B illustrates an example circuit design for altimeter module (MS5805) and FIG. 16C illustrates an example temperature sensor module (TMP109). For more general and specific information on I²C-bus specifications reference is made to http://www.nxp.com/documents/user_manual/UM10204.pdf, 2014, which is fully incorporated herein for its teaching.

Figure 17A:
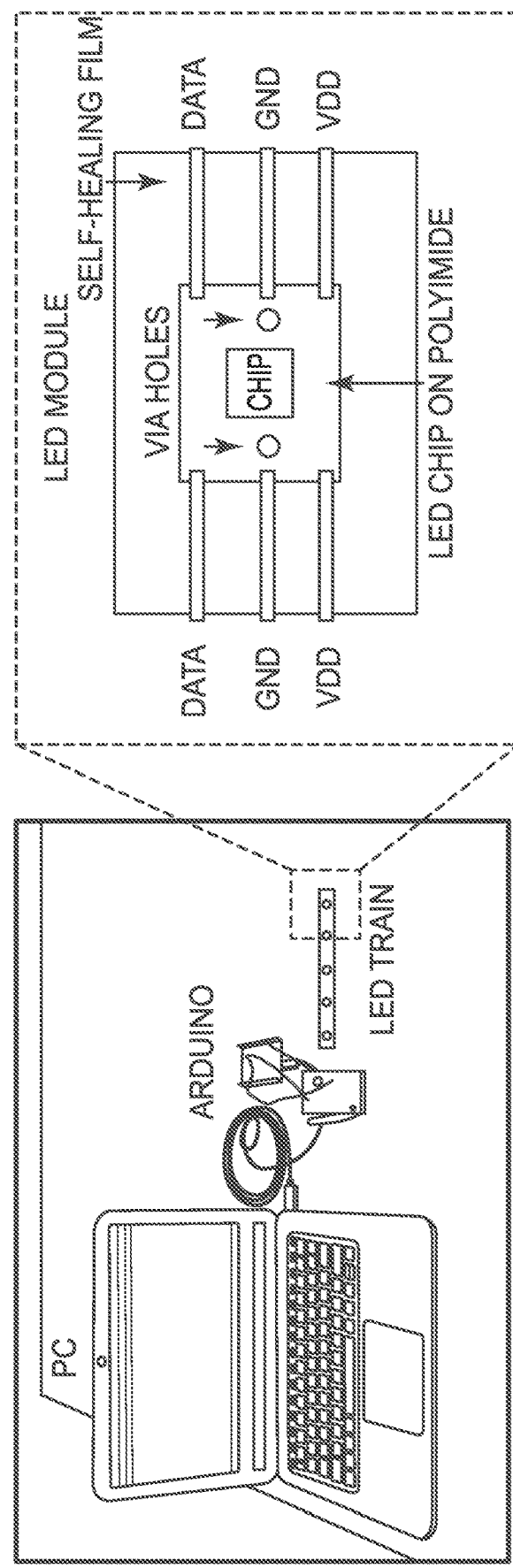
FIGS. 17A-17C illustrate an example experimental set up for an LED assembly, in accordance with various embodiments.
Figure 17B:
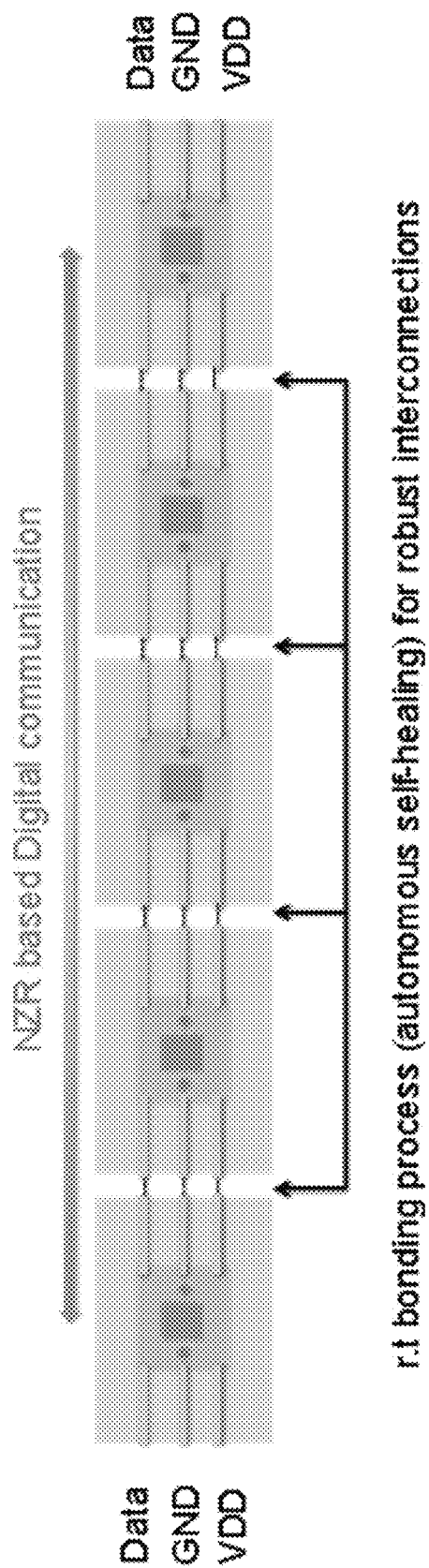
Figure 17C:
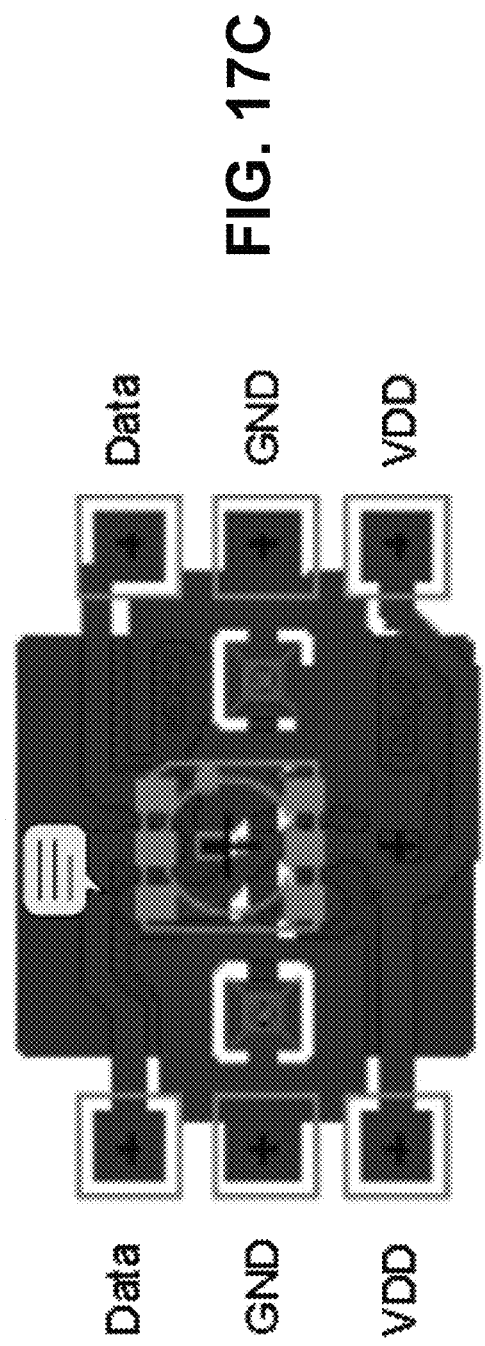

FIGS. 17A-17C illustrate an example experimental set up for an RGB LED assembly, in accordance with various embodiments. More specifically, FIG. 17A is an optical image of experimental set up for RGB LED assembly and a schematic illustration of a single RGB LED module. FIG. 17B is a schematic illustration of a linear RGB LED train. As illustrated, five modules are interconnected by a simple bonding process at room temperature for at least 2 hours. FIG. 17C illustrates an example circuit design of RGB LED module on polyimide film. For more general and specific information on RGB LED modules, reference is made to Adafruit neopixel digital rgb led strip. http://www.adafruit.com, 2015, which is fully incorporated herein for its teaching.

Figure 18A:
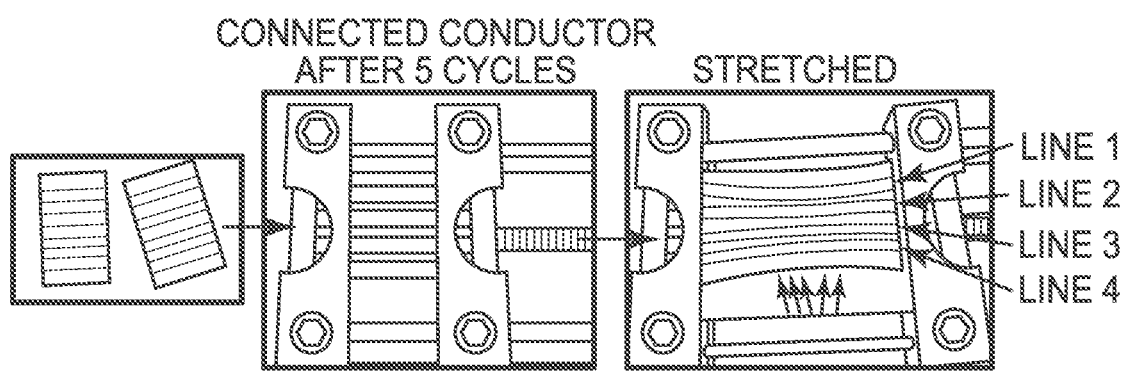
FIGS. 18A-18B illustrate examples of disconnecting and reassembling connector circuits, in accordance with various embodiments.
Figure 18B:
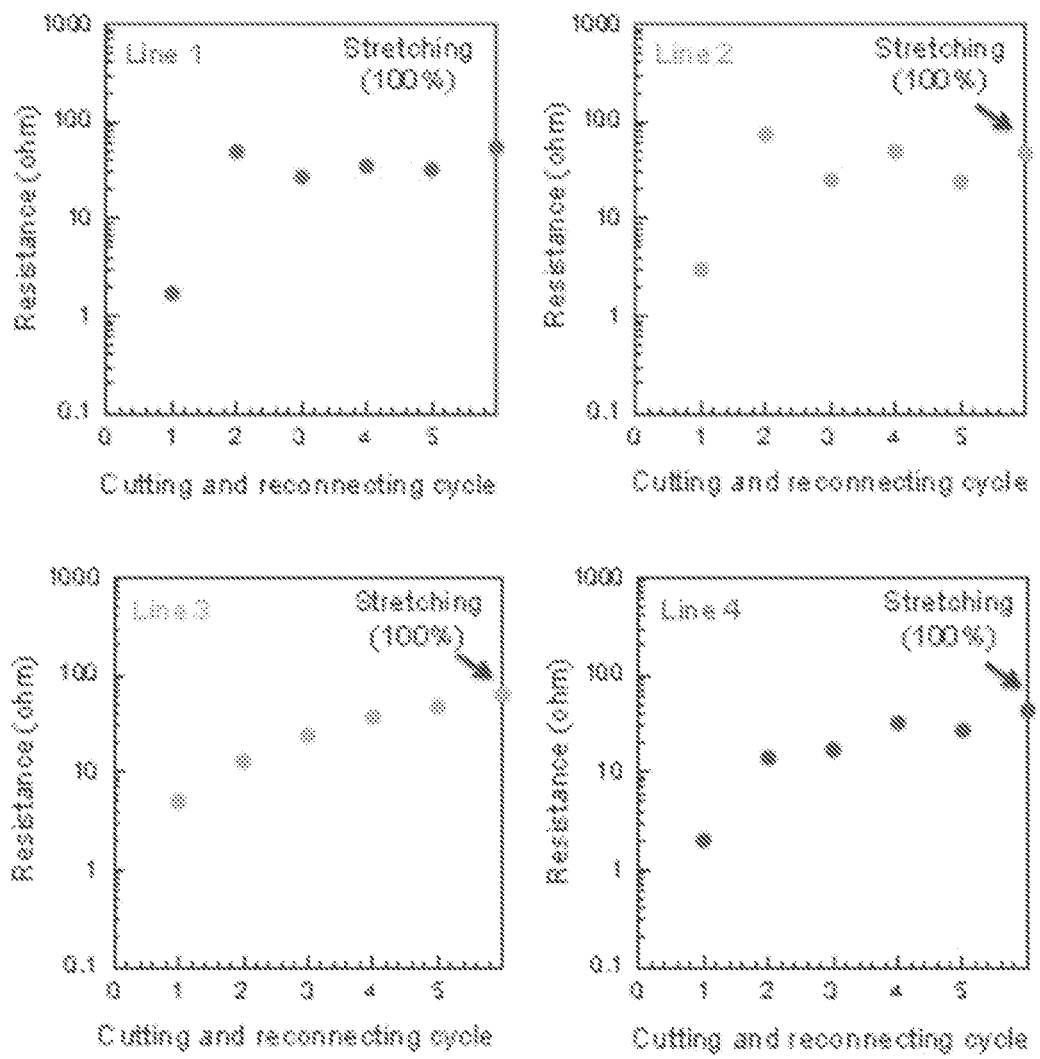

FIGS. 18A-18B illustrate examples of disconnecting and reassembling connectors, in accordance with various embodiments. FIG. 18A is optical image of a bisected polymer film with four conductive lines (left), reconnected polymer film after five cutting and reconnecting processes (middle) and stretched polymer film (right). FIG. 18B illustrates example resistance change of each conductive lines (0 percent strain) by the cutting and reconnecting process. The final spot indicates the resistance at 100 percent strain. The reconnecting process involves at least 2 hours annealing at room temperature after gentle pressing for making good contact.

Terms to exemplify orientation, such as top view/side view, before or after, upper/lower, left/right, top/bottom, above/below, and x-direction/y-direction/z-direction, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Various embodiments are implemented in accordance with the underlying Provisional Application (Ser. No. 62/569,227), entitled "Stretchable and Self-healing Elastomer-based Modular Electronics and Applications Thereof" filed on Oct. 6, 2017 and including the attached Appendix, to which benefit is claimed and which are fully incorporated herein by reference. For instance, embodiments herein and/or in the provisional application, including the Appendix, may be combined in varying degrees including wholly combined. As an example, the embodiments herein can be combined and/or include the subject matter involving the example of stretchable, tough, and self-healing elastomers, methods of forming the elastomers, and experimental embodiments illustrating features of the elastomers (e.g., FIGS. 4A-22C of the attached Appendix), as described in the Appendix. Reference may also be made to the experimental teachings and underlying references provided in the underlying provisional application. Embodiments discussed in the Appendix are not intended, in any way, to be limiting to the overall technical disclosure, or to any part of the claimed invention unless specifically noted.

As examples, the Specification describes and/or illustrates aspects useful for implementing the claimed disclosure by way of various circuits or circuitry which may be illustrated as or using terms such as blocks, modules, device, system, unit, controller, and/or other circuit-type depictions. Such circuits or circuitry are used together with other elements (robotics, electronic devices, prosthetics, processing circuitry and the like) to exemplify how certain embodiments may be carried out in the form or structures, steps, functions, operations, activities, etc. For example, in certain of the above-discussed embodiments, one or more illustrated items in this context represent circuits (e.g., discrete logic circuitry or (semi)-programmable circuits) configured and arranged for implementing these operations/activities, as may be carried out in the approaches shown in the figures. In certain embodiments, such illustrated items represent one or more circuitry and/or processing circuitry (e.g., microcomputer or other CPU) which is understood to include memory circuitry that stores code (program to be executed as a set/sets of instructions) for performing a basic algorithm (e.g., inputting, counting signals having certain signal strength or amplitude, classifying the type of force including a magnitude and direction using capacitance values output by the sensor circuitry, sampling), and/or involving sliding window averaging, and/or a more complex process/algorithm as would be appreciated from known literature describing such specific-parameter sensing. Such processes/algorithms would be specifically implemented to perform the related steps, functions, operations, activities, as appropriate for the specific application. The specification may also make reference to an adjective that does not connote any attribute of the structure ("first electronic circuit and "second electronic circuit in which case the adjective is merely used for English-language antecedence to differentiate one such similarly-named structure from another similarly-named structure (e.g., "first electronic circuit . . . " is interpreted as "circuit configured to . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. A method of forming an apparatus comprising:
   placing a first electronic circuit in contact with a second electronic circuit, wherein each of the first and second electronic circuits have connector circuits configured and arranged to provide an electrical connection between the first and second electronic circuits and are formed with a stretchable polymer film that is configured to adhere, via self-healing, to another stretchable polymer film; and
   in response to the contact, causing or facilitating the self-healing of the respective polymer films of the first and second electronic circuits and creating the electrical connection therebetween in a polymer backbone able to sustain a strain across the electrical connection of 200 percent while stretching the polymer backbone without rupturing.

2. The method of claim 1, wherein the self-healing further includes applying force on a connecting side of the first and second electronic circuits relative to the connector circuits, the connector circuits including conductive lines formed on a layer of the polymer film, and wherein the polymer film contains a conductive material on a surface or inside, the conductive material being selected from the group consisting of carbon nanotubes, silver nanowires, metallic nanowire, silver flakes, metallic flakes, silver particles, and metallic particles.

3. The method of claim 1, further including applying the strain across the electrical connection of 200 percent while stretching the polymer backbone without rupturing, wherein the self-healing includes placing the first electronic circuit in contact with the second electronic circuit for a period of time and without the application of force on either connecting side, thereby creating the electrical connection and wherein, after said applying the strain across the electrical connection, a resistance of the conductive polymer connection is less than 1 kilo-ohm, less than 100 ohm, or less than 10 ohm.

4. The method of claim 1, wherein the self-healing is at room temperature and the electrical connection is formed without soldering or use of conductive adhesives.

5. The method of claim 1, further including
   disconnecting the first electronic circuit and the second electronic circuit via cutting of the respective connector circuits.

6. The method of claim 5, further including self-healing of the respective polymer films of the first and second electronic circuits, thereby creating a different electrical connection and resulting in a different configuration, and after the step of cutting, performing a step of reassembling the respective connector circuits and mechanically testing the different electrical connection after self-healing by applying a test strain across the electrical connection, the test strain testing at a level that includes 200 percent.

7. The method of claim 1, further including creating electrical connections between a plurality of electronic circuits, including the first and second electronic circuits and at least one additional electronic circuit, via self-healing of respective polymer films.

8. The method of claim 1, further including creating electrical connections between a plurality of electronic circuits, including the first and second electronic circuits and at least one additional electronic circuit, via self-healing of respective polymer films and thereby forming a three-dimensional structure with the plurality of electronic circuits.

9. A method of forming an apparatus comprising:
   placing a first electronic circuit in contact with a second electronic circuit, wherein each of the first and second electronic circuits have connector circuits configured and arranged to provide an electrical connection between the first and second electronic circuits and are formed with a polymer film that is configured to adhere, via self-healing, to another polymer film; and
   in response to the contact, causing or facilitating the self-healing of the respective polymer films of the first and second electronic circuits, thereby creating the electrical connection therebetween, wherein the self-healing is in a presence of liquid, the polymer film having a flexible polymer backbone selected from the group consisting of: polydimethylsiloxane (PDMS), polyethyleneoxide (PEO), Perfluoropolyether (PFPE), polybutylene (PB), poly(ethylene-co-1-butylene), poly(butadiene), hydrogenated poly(butadiene), polybutylene, poly(ethylene oxide)-poly(propylene oxide) block copolymer or random copolymer, and poly(hydroxyalkanoate).

10. A method of forming an apparatus comprising:
    placing at least some of a plurality of flexible electronic circuits in contact with another of the plurality of electronic circuits, wherein each of the plurality of electronic circuits have embedded connector circuits having conductive lines configured and arranged to provide electrical connection between and which are formed with a polymer film that is configured to adhere, via self-healing, to another polymer film; and
    in response to the contact, bonding adjacent electronic circuits by causing or facilitating the self-healing of the respective polymer films of the embedded connector circuits, and thereby creating the electrical connection between respective conductive lines, wherein the bonding occurs in a presence of sweat while the apparatus is being worn.

11. The method of claim 10, wherein the plurality of flexible electronic circuits include printed electronics formed on a layer of the self-healable and flexible polymer film and the embedded connector circuits include conductive lines formed on a layer of the self-healing and flexible polymer film.

12. The method of claim 1, wherein the polymer backbone is characterized as being able to sustain notch-insensitive stretching at more than 150 percent strain.

* * * * *